US009111997B2

(12) United States Patent
Yamazaki et al.

(10) Patent No.: US 9,111,997 B2
(45) Date of Patent: Aug. 18, 2015

(54) SOI SUBSTRATE AND METHOD FOR MANUFACTURING SOI SUBSTRATE

(75) Inventors: Shunpei Yamazaki, Setagaya (JP); Maki Togawa, Atsugi (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 618 days.

(21) Appl. No.: 13/339,427

(22) Filed: Dec. 29, 2011

(65) Prior Publication Data

US 2012/0098086 A1    Apr. 26, 2012

Related U.S. Application Data

(62) Division of application No. 12/076,793, filed on Mar. 24, 2008, now Pat. No. 8,101,466.

(30) Foreign Application Priority Data

Mar. 26, 2007  (JP) .................................. 2007-079946

(51) Int. Cl.
*H01L 21/00* (2006.01)
*H01L 21/762* (2006.01)
*H01L 21/84* (2006.01)

(52) U.S. Cl.
CPC .......... *H01L 21/76254* (2013.01); *H01L 21/84* (2013.01); *H01L 2924/0002* (2013.01)

(58) Field of Classification Search
CPC .............. H01L 21/76254; H01L 21/84; H01L 2924/0002
USPC ........................................... 438/113, 33, 458
See application file for complete search history.

(56) References Cited

U.S. PATENT DOCUMENTS

| 4,566,175 A | 1/1986 | Smayling et al. |
| 4,669,177 A | 6/1987 | D'Arrigo et al. |

(Continued)

FOREIGN PATENT DOCUMENTS

| EP | 0455087 A | 11/1991 |
| EP | 1 045 448 | 10/2000 |

(Continued)

OTHER PUBLICATIONS

International Search Report (Application No. PCT/JP2008/055172) dated Jun. 24, 2008.

(Continued)

*Primary Examiner* — Laura Menz
(74) *Attorney, Agent, or Firm* — Eric J. Robinson; Robinson Intellectual Property Law Office, P.C.

(57) ABSTRACT

An SOI substrate and a manufacturing method of the SOI substrate, by which enlargement of the substrate is possible and its productivity can be increased, are provided. A step (A) of cutting a first single crystal silicon substrate to form a second single crystal silicon substrate which has a chip size; a step (B) of forming an insulating layer on one surface of the second single crystal silicon substrate, and forming an embrittlement layer in the second single crystal substrate; and a step (C) of bonding a substrate having an insulating surface and the second single crystal silicon substrate with the insulating layer therebetween, and conducting heat treatment to separate the second single crystal silicon substrate along the embrittlement layer, and forming a single crystal silicon thin film on the substrate having an insulating surface, are conducted.

10 Claims, 19 Drawing Sheets

(56) References Cited

U.S. PATENT DOCUMENTS

| | | |
|---|---|---|
| 5,374,564 A | 12/1994 | Bruel |
| 5,413,951 A | 5/1995 | Ohori et al. |
| 5,524,339 A | 6/1996 | Gorowitz et al. |
| 5,559,043 A | 9/1996 | Bruel |
| 5,567,654 A | 10/1996 | Beilstein, Jr. et al. |
| 5,618,739 A | 4/1997 | Takahashi et al. |
| 5,622,896 A | 4/1997 | Knotter et al. |
| 5,804,495 A | 9/1998 | Saito et al. |
| 6,011,607 A | 1/2000 | Yamazaki et al. |
| 6,013,563 A | 1/2000 | Henley et al. |
| 6,020,252 A * | 2/2000 | Aspar et al. ............... 438/458 |
| 6,127,702 A | 10/2000 | Yamazaki et al. |
| 6,190,998 B1 | 2/2001 | Bruel et al. |
| 6,225,192 B1 | 5/2001 | Aspar et al. |
| 6,242,320 B1 | 6/2001 | So |
| 6,271,101 B1 | 8/2001 | Fukunaga |
| 6,312,797 B1 | 11/2001 | Yokokawa et al. |
| 6,335,231 B1 | 1/2002 | Yamazaki et al. |
| 6,337,288 B1 | 1/2002 | Ohya et al. |
| 6,355,942 B1 | 3/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,602,761 B2 | 8/2003 | Fukunaga |
| RE38,296 E | 11/2003 | Moriuchi et al. |
| 6,686,623 B2 | 2/2004 | Yamazaki |
| 6,703,643 B2 | 3/2004 | Yamazaki et al. |
| 6,759,277 B1 | 7/2004 | Flores et al. |
| 6,778,164 B2 | 8/2004 | Yamazaki et al. |
| 6,803,264 B2 | 10/2004 | Yamazaki et al. |
| 6,818,529 B2 | 11/2004 | Bachrach et al. |
| 6,875,633 B2 | 4/2005 | Fukunaga |
| 6,908,797 B2 | 6/2005 | Takano |
| 6,946,365 B2 | 9/2005 | Aspar et al. |
| 7,119,365 B2 | 10/2006 | Takafuji et al. |
| RE39,484 E | 2/2007 | Bruel |
| 7,176,525 B2 | 2/2007 | Fukunaga |
| 7,176,528 B2 | 2/2007 | Couillard et al. |
| 7,192,844 B2 | 3/2007 | Couillard et al. |
| 7,199,024 B2 | 4/2007 | Yamazaki |
| 7,253,040 B2 | 8/2007 | Itoga et al. |
| 7,256,776 B2 | 8/2007 | Yamazaki et al. |
| 7,262,464 B2 | 8/2007 | Takafuji et al. |
| 7,358,158 B2 | 4/2008 | Aihara et al. |
| 7,399,681 B2 | 7/2008 | Couillard et al. |
| 7,476,940 B2 | 1/2009 | Couillard et al. |
| 7,508,034 B2 | 3/2009 | Takafuji et al. |
| 7,538,849 B2 | 5/2009 | Yamazaki et al. |
| 7,605,053 B2 | 10/2009 | Couillard et al. |
| 7,619,250 B2 | 11/2009 | Takafuji et al. |
| 7,632,739 B2 | 12/2009 | Hebras |
| 7,790,570 B2 | 9/2010 | Yamazaki |
| 7,816,736 B2 | 10/2010 | Yamazaki |
| 7,834,398 B2 | 11/2010 | Yamazaki |
| 7,838,935 B2 | 11/2010 | Couillard et al. |
| 7,924,392 B2 | 4/2011 | Yamazaki et al. |
| 8,101,466 B2 * | 1/2012 | Yamazaki et al. ............ 438/113 |
| 2002/0109144 A1 | 8/2002 | Yamazaki |
| 2003/0183876 A1 | 10/2003 | Takafuji et al. |
| 2004/0061176 A1 | 4/2004 | Takafuji et al. |
| 2004/0092087 A1 | 5/2004 | Aspar et al. |
| 2004/0104424 A1 | 6/2004 | Yamazaki |
| 2004/0238851 A1 | 12/2004 | Flores et al. |
| 2005/0009252 A1 | 1/2005 | Yamazaki et al. |
| 2005/0032283 A1 | 2/2005 | Itoga et al. |
| 2005/0098827 A1 | 5/2005 | Kanegae |
| 2005/0260800 A1 | 11/2005 | Takano |
| 2006/0038228 A1 | 2/2006 | Aitken et al. |
| 2006/0099773 A1 | 5/2006 | Maa et al. |
| 2006/0110899 A1 | 5/2006 | Bourdelle et al. |
| 2007/0020947 A1 | 1/2007 | Daval et al. |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0110917 A1 | 5/2007 | Okada |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |
| 2008/0061301 A1 | 3/2008 | Yamazaki |
| 2008/0067529 A1 | 3/2008 | Yamazaki |
| 2008/0171443 A1 | 7/2008 | Hebras |
| 2008/0213953 A1 | 9/2008 | Yamazaki |
| 2008/0237779 A1 | 10/2008 | Yamazaki et al. |
| 2008/0237780 A1 | 10/2008 | Yamazaki et al. |
| 2008/0246109 A1 | 10/2008 | Ohnuma et al. |
| 2008/0254560 A1 | 10/2008 | Yamazaki |
| 2008/0286941 A1 | 11/2008 | Yamazaki |
| 2008/0286942 A1 | 11/2008 | Yamazaki |
| 2008/0305317 A1 | 12/2008 | Ito et al. |
| 2009/0023267 A1 | 1/2009 | Daval et al. |
| 2009/0023271 A1 | 1/2009 | Couillard et al. |
| 2009/0095956 A1 | 4/2009 | Takafuji et al. |
| 2009/0107967 A1 | 4/2009 | Sakamoto et al. |
| 2010/0019242 A1 | 1/2010 | Takafuji et al. |
| 2012/0012972 A1 | 1/2012 | Takafuji et al. |

FOREIGN PATENT DOCUMENTS

| | | | |
|---|---|---|---|
| EP | 1564802 A | | 8/2005 |
| EP | 1981064 A | | 10/2008 |
| JP | 64-061943 | | 3/1989 |
| JP | 04-006875 A | | 1/1992 |
| JP | 05-211128 | | 8/1993 |
| JP | 08-320461 A | | 12/1996 |
| JP | 11-045862 | * | 2/1999 |
| JP | 11-163363 | | 6/1999 |
| JP | 2000-012864 | | 1/2000 |
| JP | 2002-198328 | | 7/2002 |
| JP | 2003-282885 | | 10/2003 |
| JP | 2003-324188 | | 11/2003 |
| JP | 2004-165600 A | | 6/2004 |
| JP | 2004-260170 | | 9/2004 |
| JP | 2004-356537 | | 12/2004 |
| JP | 2005-056917 | | 3/2005 |
| JP | 2005-228762 A | | 8/2005 |
| JP | 2005-252244 A | | 9/2005 |
| JP | 2005-294800 A | | 10/2005 |
| JP | 2006-032435 A | | 2/2006 |
| JP | 2006-210898 A | | 8/2006 |
| JP | 2007-053263 A | | 3/2007 |
| WO | WO 00/24059 | | 4/2000 |
| WO | WO 2008/087516 | | 7/2008 |

OTHER PUBLICATIONS

Written Opinion (Application No. PCT/JP2008/055172) dated Jun. 24, 2008.

International Search Report (Application No. PCT/JP2008/055167) dated Jun. 17, 2008.

Written Opinion (Application No. PCT/JP2008/055167) dated Jun. 17, 2008.

International Search Report (Application No. PCT/JP2008/055168) dated Jun. 24, 2008.

Written Opinion (Application No. PCT/JP2008/055168) dated Jun. 24, 2008.

Search Report (Application No. 08004498.5) dated Feb. 22, 2010.

Lu.F et al., "Ion-Cutting of Si Onto Glass by Pulsed and Direct-Current Plasma Immersion Ion Implantation," J. Vac. Sci. Technol. B (Journal of Vacuum Science & Technology B), 2003, vol. 21, No. 5, pp. 2109-2113.

* cited by examiner

SOI SUBSTRATE AND METHOD FOR MANUFACTURING SOI SUBSTRATE

TECHNICAL FIELD

The present invention relates to an SOI (Silicon on Insulator) substrate which has a single crystalline silicon thin film formed on a substrate having an insulating surface, and a method for manufacturing the SOI substrate. Further, the present invention relates to a semiconductor device formed using the SOI substrate. Note that the term "semiconductor device" in this specification includes all types of devices that can function utilizing semiconductor characteristics.

BACKGROUND ART

In recent years, VLSI technology has been dramatically progressed, and an SOI structure by which speeding up and low power consumption are realized has been attracted attention. In this technology, an active region (a channel formation region) of a field effect transistor (FET), which has been conventionally formed of a bulk single crystal silicon, is formed of a single crystal silicon thin film. It is known that a MOS (Metal Oxide Semiconductor) field effect transistor (MOSFET) fabricated using an SOI substrate can reduce its parasitic capacitance more than a conventional one formed using a bulk single crystal silicon substrate, and such a MOSFET is advantageous for speeding up.

As a conventional SOI substrate, a SIMOX substrate, a bonded substrate and the like are known. For example, for an SOI structure of SIMOX substrate, oxygen ions are implanted into a single crystal silicon substrate, heat treatment at 1300° C. or higher is conducted to form a buried oxide (BOX) layer, so that a single crystal silicon film is formed on the surface. In the SIMOX substrate, oxygen ion implantation can be controlled precisely and thus a single crystal silicon thin film having an even thickness can be formed with high control; however, there is a problem in that long time period is needed for oxygen ion implantation to cause problems of time and costs. Further, there is another problem in that the single crystal silicon thin film is easy to be damaged in the oxygen ion implantation.

As an SOI structure of a bonded substrate, two single crystal silicon substrates (a base substrate and a bond substrate) are bonded to each other with an oxide film therebetween, and one of the two single crystal silicon substrates (the bond substrate) is thinned on its rear side (which is not a surface to be used for bonding), so that a single crystal silicon thin film is formed. As a method for thinning, there is proposed Smart-Cut (registered trademark) employing hydrogen ion implantation (e.g., Reference 1: Japanese Published Patent Application No. H5-211128), because it is difficult to form a uniform and thin single crystal silicon thin film by grinding and polishing.

DISCLOSURE OF INVENTION

However, in conventional types of SOI substrates, an SOI structure is formed by forming a buried layer in one single crystal silicon or attaching one single crystal silicon substrate to another single crystal silicon substrate and thinning one of the single crystal silicon substrates. Therefore, such conventional types of SOI substrates depend greatly on the size of a single crystal silicon substrate, and thus have difficulty in achieving increase in size. Therefore, it is an object of the present invention to provide a manufacture technique of SOI substrate having a large area, and improve the productivity in manufacturing using such SOI substrates.

An aspect of the present invention is an SOI substrate including a single crystal silicon thin film formed on a substrate having an insulating surface. The single crystal silicon thin film can be formed by a bonding method. A feature of the present invention is forming a single crystal silicon thin film on a substrate having an insulating surface, using a single crystal silicon substrate which is processed into a desired chip size.

A specific structure of the present invention is a manufacturing method of an SOI substrate, comprising a step (A) of cutting a first single crystal silicon substrate to form a second single crystal silicon substrate which has a chip size; a step (B) of forming an insulating layer on one surface of the second single crystal silicon substrate, and forming an ion implantation layer in the second single crystal substrate; and a step (C) of bonding a substrate having an insulating surface and the second single crystal silicon substrate with the insulating layer therebetween, and conducting heat treatment to separate the second single crystal silicon substrate along the ion implantation layer, and forming a single crystal silicon thin film on the substrate having an insulating surface.

In the above structure, the step (A) is repeated to form a plurality of the second single crystal silicon substrates, and the step (B) and the step (C) are repeated to the one substrate having an insulating surface to form a plurality of the single crystal silicon thin films on the substrate having an insulating surface.

Another structure of the present invention is a manufacturing method of an SOI substrate, comprising a step (A) of forming an insulating layer on one surface of a first single crystal silicon substrate, and forming an ion implantation layer in the first single crystal silicon substrate; a step (B) of cutting the first single crystal silicon substrate to form a second single crystal silicon substrate which has a chip size; a step (C) of bonding a substrate having an insulating surface and the second single crystal silicon substrate with the insulating layer therebetween, and conducting heat treatment to separate the second single crystal silicon substrate along the ion implantation layer, and forming a single crystal silicon thin film on the substrate having an insulating surface.

In the above structure, the step (B) is repeated to form a plurality of the second single crystal silicon substrates, and the step (C) is repeated to the one substrate having an insulating surface to form a plurality of the single crystal silicon thin films on the substrate having an insulating surface.

In the above structure, the ion implantation layer is formed by implantation of hydrogen ions from the insulating layer side of the second single crystal silicon substrate or the first single crystal silicon substrate (i.e., from the surface of the second single crystal silicon substrate or the first single crystal silicon substrate, on which the insulating layer is formed). In this specification, implantation of hydrogen ions means that hydrogen is contained in the single crystal silicon substrate by irradiation with accelerated hydrogen ions. In addition, in this specification, the ion implantation layer is a region in which fine hollows are formed and which is weakened by ion irradiation to the single crystal silicon substrate, and thus the ion implantation layer is also referred to as an embrittlement layer. Separation occurs in the embrittlement layer in later heat treatment so that a single crystal silicon thin film can be formed on the substrate having an insulating surface.

In the above structure, the chip size can be set in the range of from 10 mm square (10 mm×10 mm) to 20 mm square (20 mm×20 mm). Further, a glass substrate is preferably used as the substrate having an insulating surface.

Further, another structure of the present invention is an SOI substrate including a plurality of single crystal silicon thin films formed on a substrate having an insulating surface with an insulating layer therebetween, and the size of each one of the plurality of single crystal silicon thin films is a chip size that is in the range of from 10 mm square to 20 mm square.

In the above structure, a glass substrate is preferably used as the substrate having an insulating surface.

According to the present invention, enlargement of an SOI substrate is possible. Thus, productivity in manufacturing using the SOI substrate can be increased.

BEST MODE FOR CARRYING OUT THE INVENTION

Embodiment Mode

Figure 1:
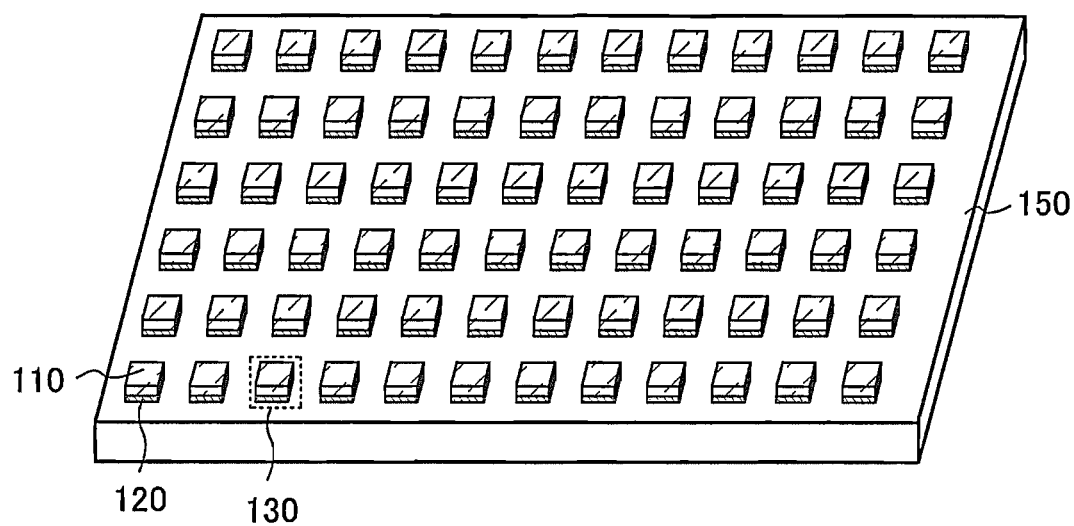
FIG. 1 is a perspective view of an example of an SOI substrate structure according to an aspect of the present invention.

Hereinafter, Embodiment Modes will be explained in detail below with reference to the accompanying drawings. It is easily understood by those skilled in the art that modes and details disclosed herein can be modified in various ways without departing from the spirit and scope of the present invention. Therefore, the present invention should not be interpreted as being limited to the description of the embodiment modes to be given below. In the structures described below, reference numerals denoting the same components are used in common in some different drawings.

Embodiment Mode 1

An SOI substrate according to the present invention is formed by being transferred from a single crystal silicon substrate (hereinafter, also referred to as a bond substrate) to a different substrate (hereinafter, a base substrate). Hereinafter, one mode of a manufacturing method of an SOI substrate according to the present invention is described.

FIG. 1 is a perspective view showing an example of an SOI substrate 100 according to the present invention. The SOI substrate 100 includes, on a surface of one substrate 150, a plurality of stacked bodies 130 in which an insulating layer 120 and a single crystal silicon thin film 110 are stacked in sequence. The single crystal silicon thin film 110 is formed on the substrate 150 with an insulating layer 120 therebetween, which is a so-called SOI structure. In other words, one SOI substrate 100 is formed from the plurality of single crystal silicon thin films 110 formed on one substrate 150.

According to an aspect of the present invention, the size of a single crystal silicon thin film 110 constituting a part of an SOI substrate corresponds to a size of a chip such as a semiconductor chip including a wireless communication semiconductor device such as an RF tag, an ID tag, an IC tag, a wireless tag, an electronic tag, an IC card, or an ID card (they are also collectively referred to as an RFID tag), or a semiconductor integrated circuit such as LSI. The chip size is designed as appropriate for use, for example, can be set in the range of from about 10 mm square to about 20 mm square. The size of the single crystal silicon thin film 110 is a size corresponding to a chip size or a size having almost the same size as a chip size. Thus, when various types of chips are formed using a completed SOI substrate, yield for each chip can be controlled. Since the single crystal silicon thin film to be used for forming elements has been sectioned to have a desired size, elements are hardly damaged in sectioning to each chip. Therefore, the use of an SOI substrate according to the present invention can increase yield. Note that the term "size" means an area in this specification.

As the substrate 150, a substrate having an insulating surface such as a glass substrate or a quartz substrate is used. A glass substrate is preferably used as the substrate 150, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm). A mother glass substrate having a large area is used as a base substrate (here, the substrate 150), and an SOI substrate is formed by applying the present invention. Thus, the area of the SOI substrate can be enlarged. For example, in the case where a semiconductor device such as an RF tag or the like is formed using an SOI substrate, a large number of chips can be formed at one time, and the number of formed chips can be increased, thereby increasing yield dramatically.

Next, the manufacturing method of the SOI substrate shown in FIG. 1 is specifically described with reference to FIGS. 2A, 2B and FIGS. 3A to 3D.

Figure 3A:
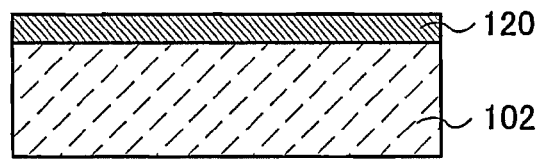
FIGS. 3A to 3D illustrate an example of a manufacturing method of an SOI substrate according to an aspect of the present invention.

First, a single crystal silicon substrate 102 to serve as a bond substrate is prepared (FIG. 3A). As the single crystal silicon substrate 102, a substrate which has been processed to a desired shape and size is prepared.

Figure 2A:
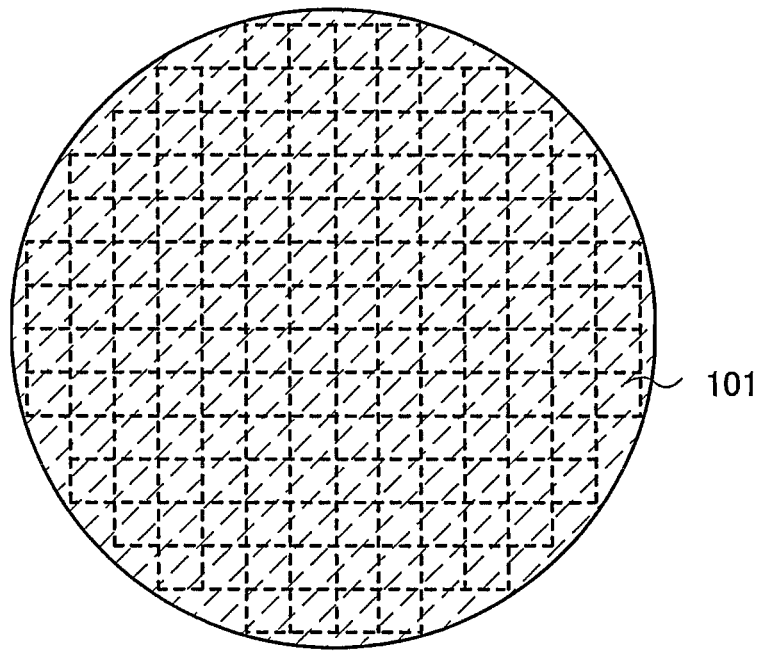
FIGS. 2A and 2B illustrate an example of a manufacturing method of an SOI substrate according to an aspect of the present invention.
Figure 2B:
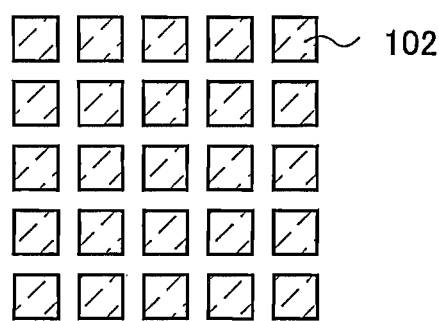

As illustrated in FIGS. 2A and 2B, a single crystal silicon substrate 101 (hereinafter, also referred to as a first single crystal silicon substrate) is cut, so that the single crystal silicon substrate 102 having a desired size and shape (hereinafter, also referred to as a second single crystal silicon substrate) can be obtained. The first single crystal silicon substrate 101 used at this time may be a commercial substrate. As commercial single crystal silicon substrates, typically, substrates which are 5 inches in diameter (125 mm), 6 inches in diameter (150 mm), 8 inches in diameter (200 mm), and 12 inches in diameter (300 mm), and most of such substrates are circular. In addition, the thickness of the first single crystal silicon substrate 101 can be selected from up to about 1.5 mm as appropriate. In this embodiment mode, the thickness of the first single crystal silicon substrate 101 is set in the range of from about 0.7 mm to 0.75 mm.

The second single crystal silicon substrate 102 preferably has a chip size of a wireless communication semiconductor device such as an RF tag or a semiconductor chip including a semiconductor integrated circuit such as an LSI, or the like. The chip size can be set as appropriate for the purpose, and for example, when an RF tag is manufactured, a size of about 10 mm square to 20 mm square can be adopted. In addition, there are no particular limitations on the shape of the processed second single crystal silicon substrate 102, and it may be selected as appropriated for that purpose. For example, a rectangular shape (including a square) is preferable, since by employing a rectangular shape, a process can be easily conducted and the second single crystal silicon can be bonded to the substrate 150 serving as a base substrate with high accuracy. Further, by employing a rectangular shape for the second single crystal silicon substrate 102, a large number of second single crystal silicon substrates can be efficiently taken out of the first single crystal silicon substrate 101.

For cutting the second single crystal silicon substrates 102 out of the first single crystal silicon substrate 101, a cutting device such as a dicer or a wire saw, a device using a laser beam, a device using plasma, a device using an electron beam or an optional device for cutting can be used.

In this embodiment mode, a circular substrate having a diameter of 8 inches is used as the first single crystal silicon substrate 101, and out of the substrate, the second single crystal silicon substrate 102 which is 10 mm square is obtained by processing. In this case, about 300 pieces of the second single crystal silicon substrate 102 can be obtained. The obtained second single crystal silicon substrate 102 serves as a bond substrate.

Next, an insulating layer 120 is formed on a surface of the second single crystal silicon substrate 102 (FIG. 3A).

The insulating layer 120 can be formed by a CVD method or a sputtering method, but the insulating layer 120 is preferably formed by a thermal oxidation method, so that a dense film having favorable characteristics can be obtained. When a thermal oxidation method is employed, a silicon oxide ($SiO_x$) film is formed as the insulating layer 120. In addition, when a CVD method or the like is employed, a silicon oxide ($SiO_x$) layer, a silicon nitride ($SiN_x$) layer, a silicon oxynitride layer, a silicon nitride oxide layer or the like may be formed as the insulating layer 120. The insulating layer 120 may have a single layer structure or a stacked layer structure. For example, it is also possible that after a dense silicon oxide film is formed by a thermal oxidation method, a silicon nitride layer or a silicon nitride oxide layer may be formed by a CVD method. Note that the insulating layer 120 should be formed on at least one surface of the second single crystal silicon substrate 102, or may be formed on the entire surface including sides and a rear surface. In addition, the insulating layer 120 is formed to a thickness of from 50 nm to 3000 nm, inclusive, preferably from 50 nm to 200 nm, inclusive. In this embodiment mode, as the insulating layer 120, a silicon oxide layer having a thickness of 100 nm is formed by a thermal oxidation method.

Figure 3B:
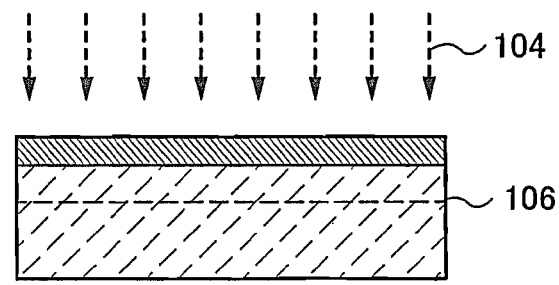

Next, irradiation with hydrogen ions 104 is performed on the second single crystal silicon substrate 102 to form an embrittlement layer 106 (FIG. 3B). Irradiation with the hydrogen ions 104 is conducted from the side of the surface on which the insulating layer 120 is formed. By irradiation with the hydrogen ions 104 accelerated with electric field, the embrittlement layer 106 is formed at a predetermined depth (depth in a film thickness direction) of the second single crystal silicon substrate 102. Note that the embrittlement layer 106 may be formed using a noble gas, not using hydrogen, or alternatively, a mixed gas of hydrogen and a noble gas.

The embrittlement layer 106 may be formed by irradiation with ions by an ion-doping method or an ion implantation method. The ion-doping method is a method in which an ionized gas is accelerated with electric field without being subjected to mass separation, and irradiation with the ionized gas is performed on a single crystal silicon substrate. The ion-doping method may be conducted with an ion-doping apparatus. In addition, the ion implantation method is a method in which a gas ionized with an ion implantation apparatus is subjected to mass separation and irradiation with the ionized gas is performed on a single crystal silicon substrate. By the ion-implantation method, ionized hydrogen gas is subjected to mass separation and accelerated by electric field, so that the ionized gas can be irradiated.

Irradiation with the hydrogen ions 104 is preferably conducted under conditions of dosage of from $1\times10^{16}$ atoms/cm$^2$ to $1\times10^{17}$ atoms/cm$^2$, and an accelerating voltage of from 20 kV to 200 kV. Note that the dosage, the accelerating voltage, and the like of the hydrogen ions 104 for irradiation are selected suitably so that the thickness in depth direction of the embrittlement layer 106 formed in the second single crystal silicon substrate 102 can be controlled. In the second single crystal silicon substrate 102, the thickness in depth direction in which the embrittlement layer 106 is to be formed determines the thickness of the single crystal silicon thin film of an SOI substrate to be completed. Therefore, by appropriate selection of irradiation conditions of the hydrogen ions 104, the thickness of the single crystal silicon thin film of the SOI substrate can be controlled. By irradiation with the hydrogen ions 104 through the insulating layer 120, the depth of the embrittlement layer 106 is easy to be controlled and further, roughness of the surface of the silicon substrate due to the ion irradiation can be prevented. In this embodiment mode, irradiation with the hydrogen ions 104 is conducted at a dosage of $5 \times 10^{16}$ atoms/cm$^2$ and an accelerating voltage of 100 kV.

Here is shown an example in which the single crystal silicon substrate is sectioned into the plurality of single crystal silicon substrates having a desired chip size and the single crystal silicon substrate having a chip size is irradiated with hydrogen ions to form an embrittlement layer. However, the step of sectioning the single crystal silicon substrate into a desired chip size and the step of irradiating the single crystal silicon substrate with hydrogen ions to form an embrittlement layer may be reverse in that order.

Specifically, irradiation with hydrogen ions is performed on the single crystal silicon substrate serving as a mother substrate as illustrated in FIG. 2A to form an embrittlement layer. Then, the single crystal silicon substrate including the embrittlement layer therein is sectioned into single crystal silicon substrate having a desired chip size and thus the single crystal silicon substrates having a chip size, in which the embrittlement layer is formed, can be obtained.

Figure 3C:
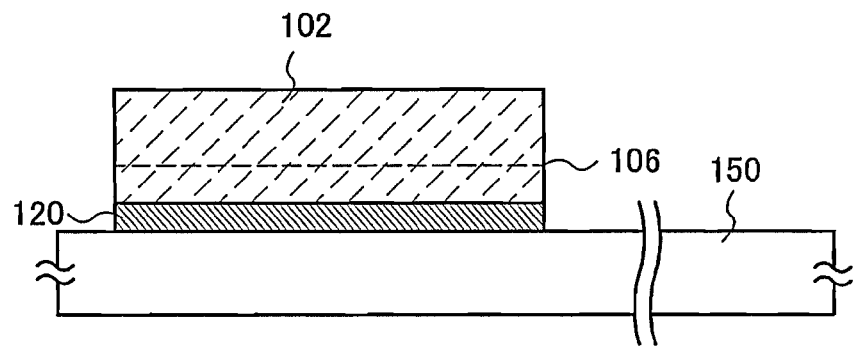

Next, the second single crystal silicon substrate 102 serving as a bond substrate and the substrate 150 serving as a base substrate are bonded to each other (FIG. 3C). The second single crystal silicon substrate 102 and the substrate 150 are bonded to each other with the insulating layer 120 formed on the second single crystal silicon substrate 102, between the second single crystal silicon substrate 102 and the substrate 150.

As the substrate 150 serving as a base substrate, a substrate having an insulating surface such as a glass substrate or a quartz substrate as described above is used. A glass substrate is preferable, since the glass substrate can achieve a larger area at low cost.

An insulating layer may be formed on a surface of the substrate 150 as a base insulating layer. Specifically, an insulating layer is formed on the surface of the substrate 150, onto which the second single crystal silicon substrate 102 is bonded. For example, an insulating layer with a single layer or a stacked layer may be formed over the surface of the substrate 150, using silicon nitride oxide, silicon oxide, silicon nitride, silicon oxynitride or the like, by a CVD method or a sputtering method. By forming the insulating layer serving as a base insulating layer on the surface of the substrate 150, diffusion of impurities such as alkali metals from the substrate 150 can be prevented. For example, as the base insulating layer, a silicon nitride layer or a silicon nitride oxide layer is used for a bottom layer, and a silicon oxide layer or a silicon oxynitride layer is used for a top layer to form a stack layer structure, which can increase the effect of blocking impurities more.

Bonding (also referred to as wafer bonding) of the second single crystal silicon substrate 102 and the substrate 150 are conducted at a processing temperature which is set in consideration of heat resistance of both substrates. When a glass substrate is used for the substrate 150 serving as a base substrate, a processing temperature of about 600° C. or lower should be adopted for the process.

For example, by processing using irradiation of atom beams or ion beams, or plasma treatment or radical treatment, the substrates can be bonded to each other at a low temperature process of from 200 to 400° C.

When atom beams or ion beams are used, a neutral atomic beam of an inert gas such as argon or an ion beam of an inert gas can be used. Note that irradiation of atomic beams or ion beams is preferably conducted in vacuum or under reduced pressure.

For example, the surface to be bonded of the second single crystal silicon substrate 102 (hereinafter, also referred to as a bonding surface) is subjected to irradiation of argon ion beams, so that the bonding surface is activated. Note that bonding of the second single crystal silicon substrate 102 and the substrate 150 is conducted with the insulating layer 120 therebetween, and thus the surface of the insulating layer 120 serves as a bonding surface. By the irradiation of argon ion beams, the surface of the insulating layer 120, which serves as a bonding surface, can be activated. Similarly, the bonding surface of the substrate 150 is subjected to irradiation of argon ion beams, so that the bonding surface is activated. In addition, in the case where an insulating layer serving as a base insulating layer is formed on the surface of the substrate 150 and bonded to the second single crystal silicon substrate with the insulating layer therebetween, irradiation of argon ion beams is conducted to the surface of the insulating layer serving as a base insulating layer, so that the surface is activated. In order to activate the bonding surface, argon ion beams having energy of from 20 eV to 200 eV is preferably used for the irradiation. The irradiation of argon ion beams is preferably conducted under pressure of the order of $10^{-6}$ Pa.

Next, the activated bonding surface of the second single crystal silicon substrate 102 and the activated bonding surface of the substrate 150 are made in contact with each other and are superposed. The bonding surfaces of the second single crystal silicon substrate 102 and the substrate 150 are activated, and thus bonding at least due to activation of the surfaces occurs, so that both the substrates are bonded to each other.

In addition, when plasma treatment or radical treatment is used, specifically, oxygen ($O_2$) plasma, an oxygen radical, nitrogen ($N_2$) plasma, or a nitrogen radical can be used.

For example, the bonding surface of the second single crystal silicon substrate 102 is subjected to oxygen plasma irradiation, so that the bonding surface is activated (becomes hydrophilic). In addition, the second single crystal silicon substrate 102 and the substrate 150 are bonded with the insulating layer 120 therebetween, so that the surface of the insulating layer 120 serves as the bonding surface. Thus, the surface of the insulating layer 120 serving as the bonding surface is made hydrophilic by the oxygen plasma treatment. Similarly, the bonding surface of the substrate 150 is subjected to oxygen plasma irradiation so as to have a hydrophilic property. In addition, when an insulating layer serving as a base insulating layer is formed on the surface of the substrate 150, and the substrate 150 is bonded to the second single crystal silicon substrate with the insulating layer therebetween, the surface of the insulating layer serving as a base insulating layer is subjected to oxygen plasma treatment so as to have a hydrophilic property. When or after the bonding surface is made hydrophilic, a gas containing hydrogen ions, a hydroxyl group, water molecule or the like may be mixed. Such a gas is mixed in the hydrophilic process, and thus it is possible that an OH group in the bonding surface is increased to make the bonding surface hydrophilic evenly, or to increase the speed of becoming hydrophilic. In addition, after impurities in the bonding surface are removed by argon plasma irradiation, the oxygen plasma treatment can be conducted to make the bonding surface hydrophilic evenly. Further, after making the bonding surface hydrophilic, the bonding surface may be washed with pure water, water added with hydrogen, water with oxygen or water added with ozone, and dried.

Preferably, after the bonding surface is washed by ultrasonic wave or megasonic wave, to remove particles such as micro dusts attached to the bonding surface, the bonding surface is subjected to surface activation treatment utilizing atomic beams or ion beams, or hydrophilic treatment utilizing plasma treatment or radical treatment. In addition, before bonding, the hydrophilic property is preferably increased by washing with water added with ozone.

Next, the hydrophilic bonding surface of second single crystal silicon substrate 102 and the hydrophilic bonding surface of the substrate 150 are made to be in contact with each other and are superposed. The bonding surfaces of the second single crystal silicon substrate 102 and the substrate 150 are made hydrophilic, and both are bonded to each other at least due to force among molecules (hydrogen bonding).

After the bonding surfaces are made hydrophilic by oxygen plasma treatment, the bonding surfaces may be irradiated with nitrogen radicals. Irradiation with nitrogen radicals changes an OH group produced in the hydrophilic bonding surface into an ON group by nitrogen substitution. After that, the bonding surfaces are made in contact with each other and superposed, so that a nitrogen compound is formed at the interface between the bonding surfaces. As a result, the bonding surfaces are bonded to each other more firmly.

In addition, after the bond substrate and the base substrate are made in contact and bonded to each other by using atomic beams or plasma, heat treatment or pressuring treatment, or both of the heat treatment and the pressuring treatment is/are preferably conducted. By the heat treatment and/or pressuring treatment, the bonding strength between the substrates is increased, so that the substrates can be bonded more firmly. The temperature for heat treatment is set to a temperature below the temperature limit of both the substrates, and the pressure for pressuring treatment is set in consideration of resistance to pressure of the substrates. In addition, the pressuring treatment is preferably conducted in the direction perpendicular to the bonding surface. For example, after the second single crystal silicon substrate 102 and the substrate 150 are bonded to each other by using atomic beams or ion beams, or utilizing plasma treatment or radical treatment as described above, heat treatment is conducted at temperatures of from 200° C. to 400° C.

Figure 3D:
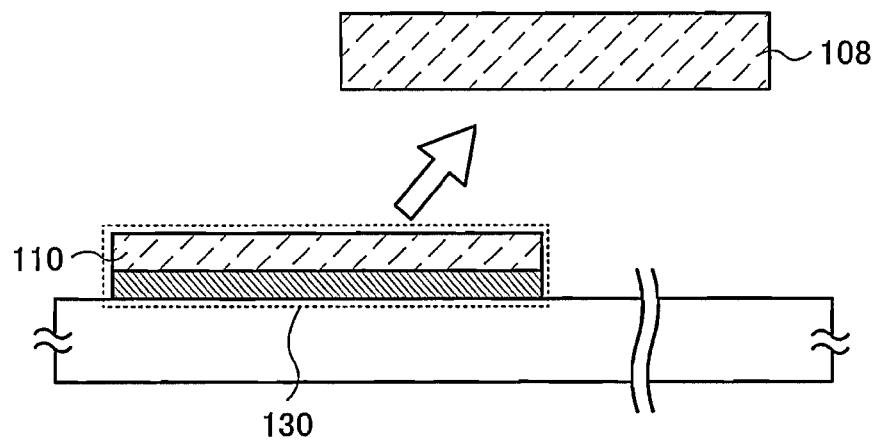

Next, a single crystal silicon layer 108 which is a part of the second single crystal silicon substrate 102 is separated. The single crystal silicon thin film 110 is left on the substrate 150, with the insulating layer 120 between the substrate 150 and the single crystal silicon thin film 110, so that an SOI structure is obtained (FIG. 3D).

The second single crystal silicon substrate 102 is subjected to heat treatment, so that separation occurs at the embrittlement layer 106. Specifically, heat treatment is conducted at temperatures of from 500 to 600° C., so that volume change of minute cavities formed in the embrittlement layer 106 occurs, and a broken face is produced along the embrittlement layer 106 for separation. The second single crystal silicon substrate 102 is separated along the embrittlement layer 106, so that the single crystal silicon layer 108 is separated. As a result, the single crystal silicon thin film 110 is formed on the substrate 150 with the insulating layer 120 therebetween. Here, the structure in which the insulating layer 120 and the single crystal silicon thin film 110 are stacked in sequence over the substrate 150 is referred to as the stacked body 130.

Figure 4A:
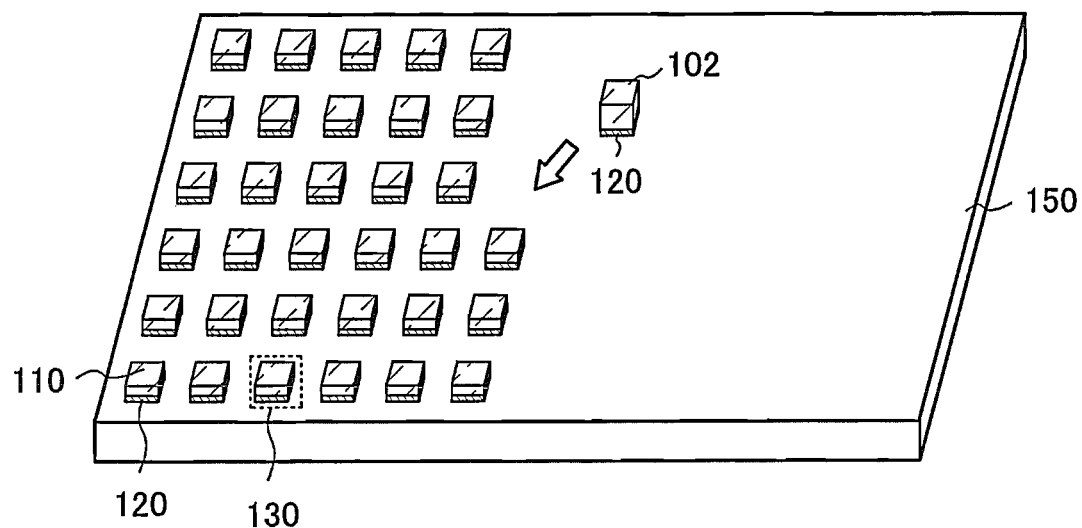
FIGS. 4A and 4B are perspective views of a manufacturing method of an SOI substrate according to an aspect of the present invention.
Figure 4B:
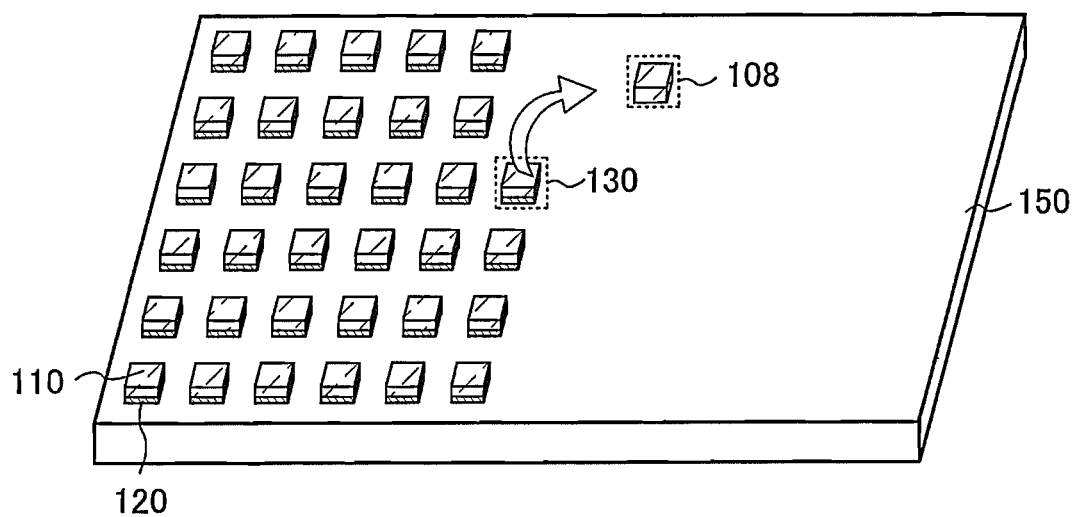

In this manner described above, an SOI structure is obtained in which the single crystal silicon thin film 110 is formed on the substrate 150 with the insulating layer 120 therebetween. It should be noted that one feature of the present invention is that a plurality of stacked bodies formed using the single crystal silicon thin films are formed on one base substrate with the insulating layers therebetween, to form an SOI substrate. For example, by repeating steps illustrated in FIGS. 3A to 3D, the plurality of stacked bodies 130 are disposed closely on the substrate 150 as illustrated in FIGS. 4A and 4B, so that the SOI substrate 100 can be manufactured.

Figure 5A:
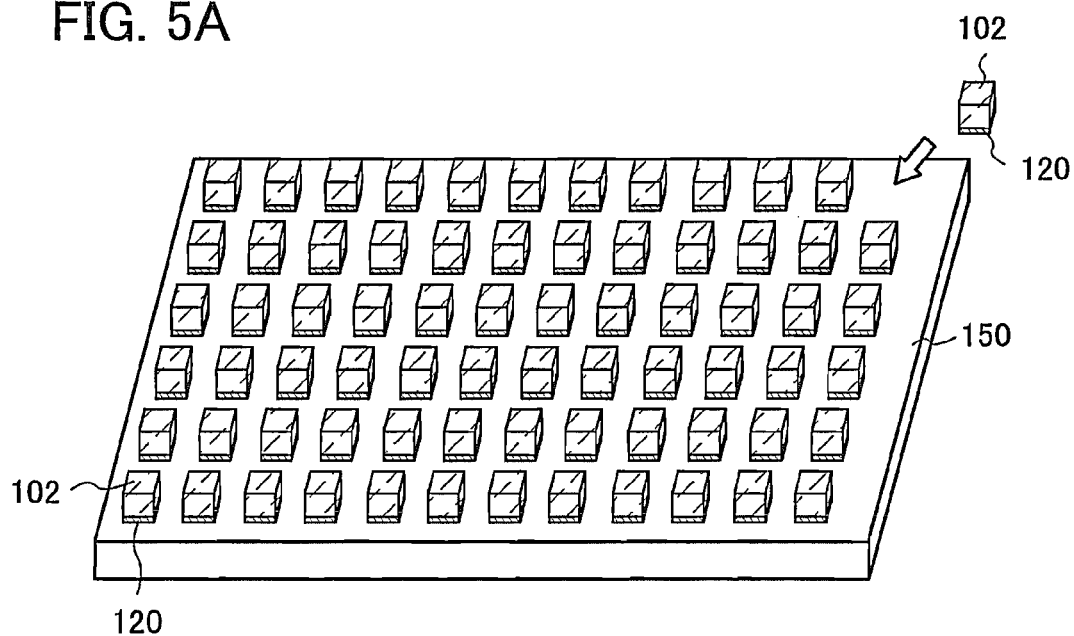
FIGS. 5A and 5B are perspective views of a manufacturing method of an SOI substrate according to an aspect of the present invention.
Figure 5B:
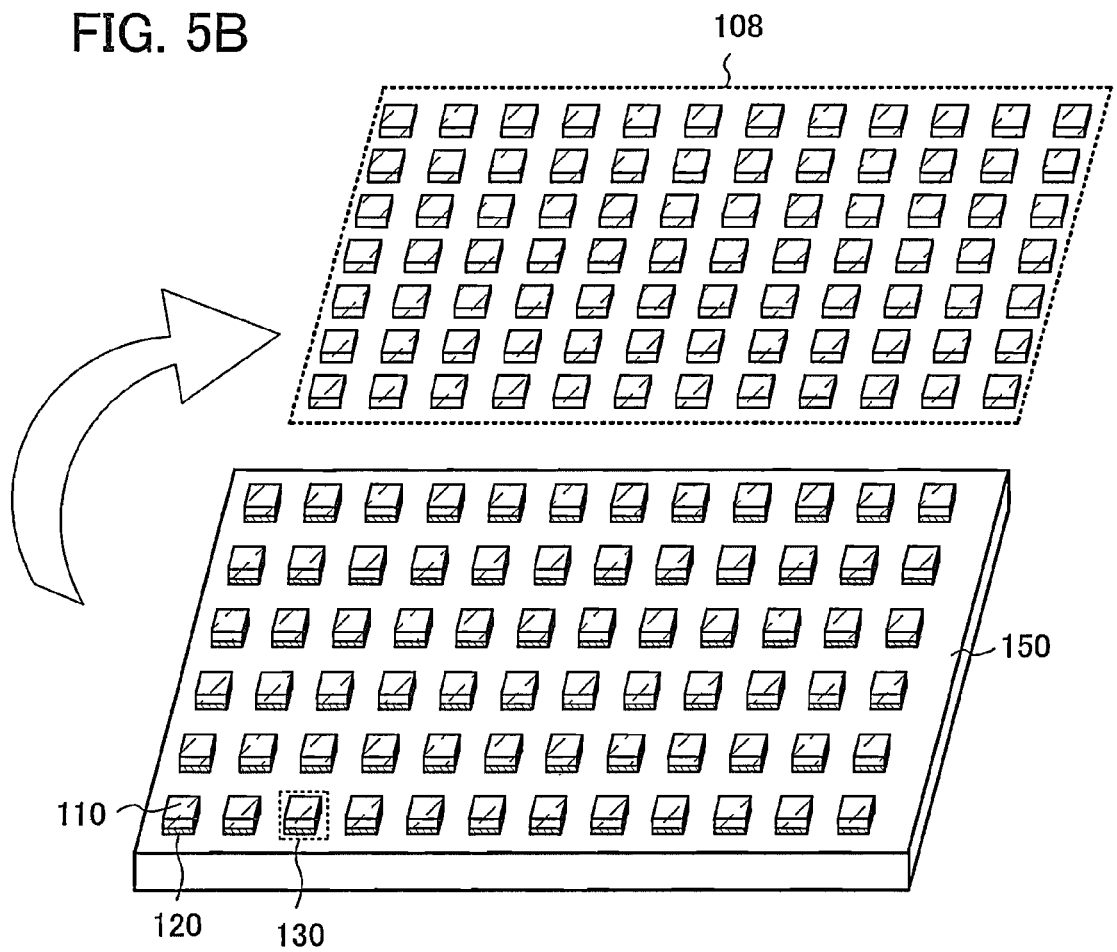

After bonding is conducted as illustrated in FIGS. 3A to 3C, instead of conducting the step of separation by heat treatment, as illustrated in FIGS. 5A and 5B, the next single crystal silicon substrate is bonded, and bonding of all single crystal silicon substrates are completed and separation of the all single crystal silicon substrates may be conducted together by heat treatment. In this manner, the process can be simplified.

The plurality of single crystal silicon substrates, which are regarded as one group, may be subjected to steps illustrated in FIGS. 4A and 4B or FIGS. 5A and 5B. Specifically, the plurality of single crystal silicon substrates are combined to be one group such that it has a size n (n is an optional positive integer, n≥1) times as large as one shot size of an exposure apparatus typified by a stepper exposure apparatus, and may be subjected to the steps illustrated in FIGS. 4A and 4B or FIGS. 5A and 5B, so that an SOI substrate can be manufactured. The size of one shot of an exposure apparatus depends on the apparatus, and for example, when an existing stepper is used, the sizes of one shot, such as 25 mm square, 100 mm square, 113 mm square, 132 mm square, 144 mm square and the like are known. For example, in a case where an exposure apparatus having one shot size of 100 mm square is used in a manufacturing process, and the size of a single crystal silicon substrate serving as a bond substrate is a chip size of about 20 mm square, one group of 5×5 pieces of single crystal silicon substrates as illustrated in FIG. 2B is processed so as to efficiently form a desired circuit pattern. Accordingly, yield can be increased in manufacturing semiconductor devices.

The stacked bodies 130 (single crystal silicon thin films 110) can be disposed on the substrate 150 with use of a control device such as a CCD camera or a computer. Further, position alignment using a marker formed on the substrate 150 or the stacked bodies 130 (single crystal silicon thin films 110) may be done.

The surface of the single crystal silicon thin films obtained by the separation are each preferably polished to be planarized by chemical mechanical polishing (CMP). In addition, instead of using a physical polishing means such as CMP, the surface of the single crystal silicon thin film may be planarized by laser irradiation. Note that the laser irradiation is preferably conducted under a nitrogen atmosphere having an oxygen concentration of 10 ppm or lower. This is because laser irradiation under an oxygen atmosphere may make the surface of the single crystal silicon thin film rough. Further, CMP or the like may be conducted for the sake of thinning the obtained single crystal silicon thin film.

Through the above steps, the SOI substrate 100 can be manufactured.

An SOI substrate according to the present invention has a structure in which a plurality of single crystal silicon thin films each having a chip size are provided on a substrate. In this manner, a desired chip can be obtained using one single crystal silicon thin film and yield can be increased. In transferring a single crystal silicon thin film from a single crystal silicon substrate serving as a bond substrate to a substrate having an insulating surface and serving as a base substrate, even if defects occur in crystal in the single crystal silicon thin film, yield for each chip can be managed.

In addition, because the transfer from the bond substrate to the base substrate is conducted on a chip size basis, stress such as applied force can be reduced in bonding films to another substrate and thus yield can be increased.

Further, a larger area SOI substrate can be obtained by forming a plurality of single crystal silicon films on a substrate, according to the present invention. Thus, a large number of chips can be manufactured in one time of a manufacturing process, thereby increasing productivity dramatically.

Figure 6A:
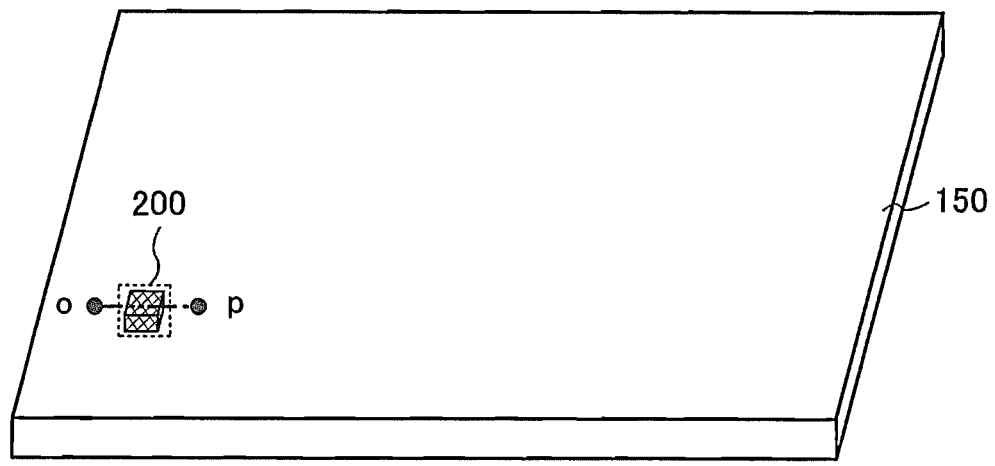
FIGS. 6A, 6B and 6C are a perspective view, a cross-sectional view and a top view of an example of a semiconductor device according to an aspect of the present invention, respectively.
Figure 6B:
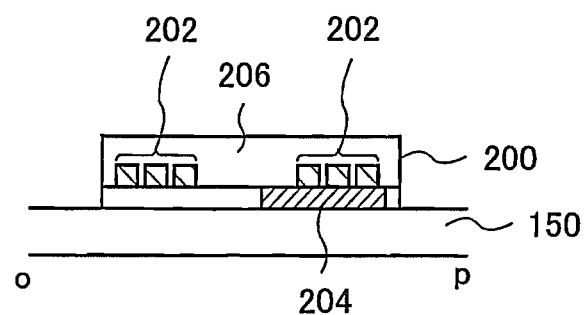
Figure 6C:
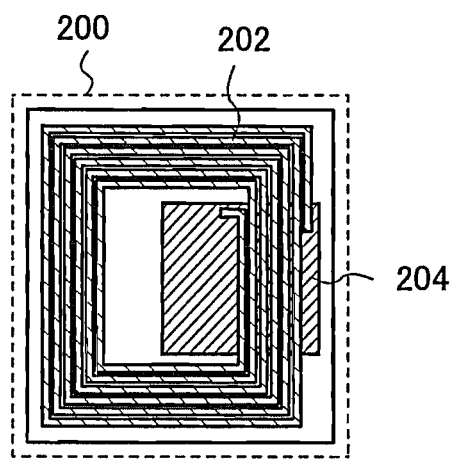

By using an SOI substrate manufactured as described above, a wide variety of chips can be manufactured. For example, FIGS. 6A to 6C schematically illustrate an example of a semiconductor device manufactured using an SOI substrate according to the present invention. An example is shown in which an RF tag is formed as a semiconductor device for wireless communication. FIGS. 6A, 6B and 6C are a perspective view, a cross-sectional view taken along the line o-p in FIG. 6A, and a top view of an RF tag, respectively. FIGS. 6A to 6C show only one RF tag 200 for convenience.

The RF tag 200 includes an antenna 202 configured to transmit and receive a signal, and a circuit portion 204 in which a variety of circuits are integrated, such as a circuit configured to analyze a signal received by the antenna 202 and a circuit configured to generate power from a received signal. The bottom (bottom surface) of the circuit portion 204 is supported by the substrate 150 and the top surface thereof is sealed together with the antenna 202 by a sealing layer 206. After desired RF tags are formed using the SOI substrate, the RF tags may be divided into each chip appropriately.

An example of a manufacturing method and a structure of the RF tag 200 will now be described with reference to FIG. 7A to FIG. 10.

Figure 7A:
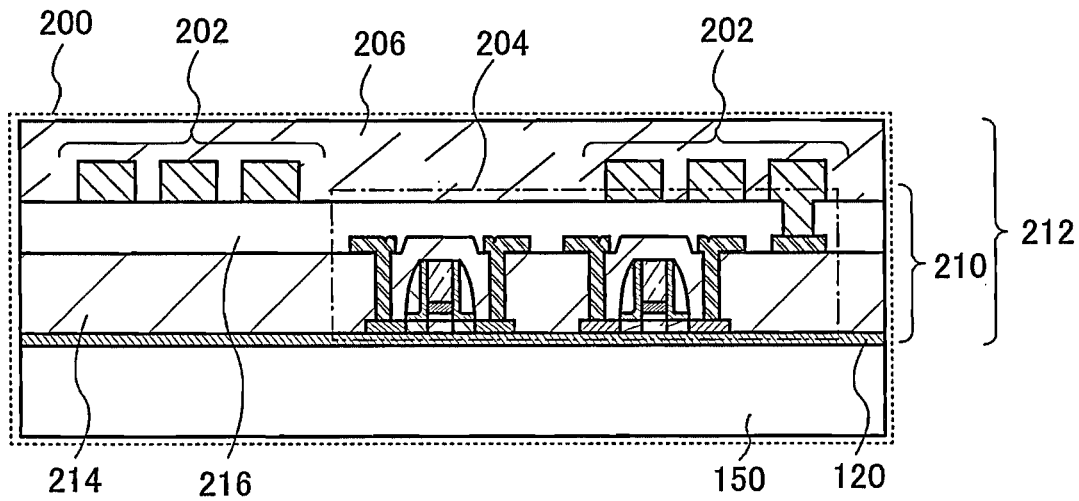
FIGS. 7A and 7B are a cross-sectional view and an appearance view of an example of a semiconductor device according to an aspect of the present invention, respectively.
Figure 7B:
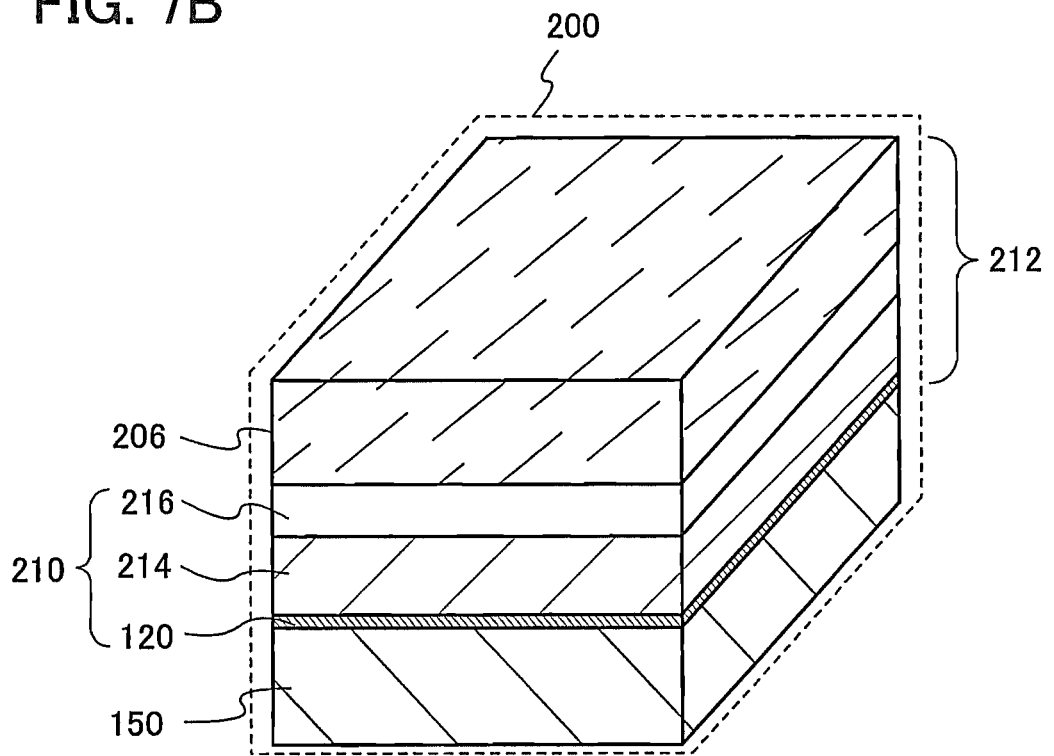

FIG. 7A schematically illustrates the RF tag 200, and FIG. 7B schematically illustrates an appearance of the RF tag 200. The RF tag 200 includes an element layer 210 in which a circuit portion 204 and an antenna 202 connected the circuit portion 204 are stacked over the substrate 150, and a sealing layer 206 which seals the surface of the element layer 210, and the sealing layer 206 is stacked over the element layer 210. The element layer 210 is sandwiched between the substrate 150 and the sealing layer 206.

In the circuit portion 204, a circuit including transistors is integrated. FIG. 7A illustrates the cross-section of the circuit portion 204 including two transistors for convenience.

The element layer 210 is formed in a manufacturing process of transistors. A side face of the element layer 210 is a stacked film of insulating layers 214 and 216 which are formed in manufacturing the antenna 202 and the circuit portion 204. In the element layer 210, the antenna 202 and the circuit portion 204 have a bottom portion (a lower surface in forming the element layer 210 is regarded as the bottom portion for convenience) protected by the substrate 150, a top face sealed with the sealing layer 206, and the side face covered with the stacked film of the insulating layers 214 and 216.

Next, an example of a manufacturing method of the RF tag 200 illustrated in FIGS. 7A and 7B is described with reference to drawings.

Figure 8A:
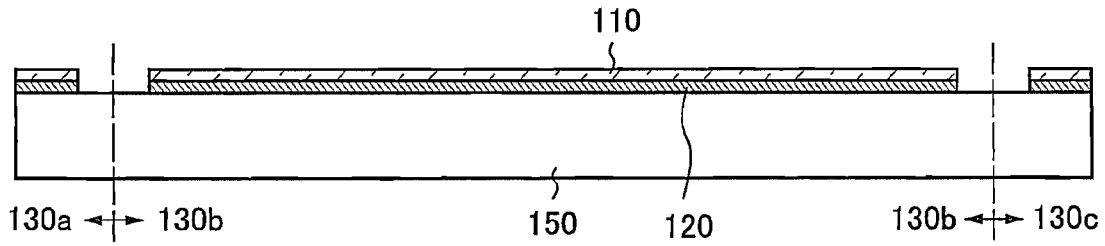
FIGS. 8A to 8D illustrate an example of a manufacturing method of a semiconductor device according to an aspect of the present invention.

First, an SOI substrate according to the present invention is prepared (FIG. 8A). In this case, a substrate in which a plurality of single crystal silicon thin films are formed over the substrate 150 with the insulating layer 120 therebetween, as illustrated in FIG. 1, is used. Note that the SOI substrate is provided with the plurality of single crystal silicon thin films which are processed to have desired chip sizes. An example is described here, in which an RF tag is formed in a stacked body 130b including one single crystal silicon thin film (i.e., a stacked body including one single crystal silicon thin film corresponding to one chip size) for convenience. Needless to say, RF tags can be formed in adjacent stack bodies 130a and 130c at the same time.

Figure 8B:
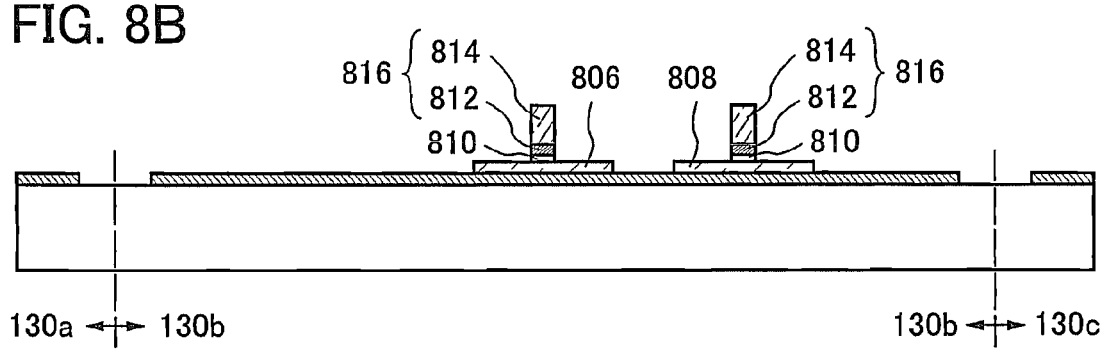

The single crystal silicon thin film 110 is selectively etched to form a first single crystal silicon layer 806 and a second single crystal silicon layer 808. Then gate electrodes 816 are formed over the first single crystal silicon layer 806 and the second single crystal silicon layer 808 with the gate insulating layer 810 therebetween (FIG. 8B).

The first single crystal silicon layer 806 and the second single crystal silicon layer 808 are selectively etched to be processed into desired shapes. At this time, the layers are processed into island shapes and isolated. In a case where the thicknesses of the first single crystal silicon layer 806 and the second single crystal silicon layer 808 are to be desired to be smaller than that of the single crystal silicon thin film of the prepared SOI substrate, the single crystal silicon thin film may be etched to be thinner. In addition, the single crystal silicon thin film may be partially changed in its quality (quality change) and the altered portion may be selectively etched to be thinner. Quality change of the single crystal silicon thin film indicates oxidation treatment, nitriding treatment or the like. In addition, the first single crystal silicon layer 806 and the second single crystal silicon layer 808 may be formed such that the end portions thereof are either near-perpendicularly tapered or gently tapered by appropriate selection of etching conditions or the like. For example, the end portions may be tapered at a taper angle of 45° or more and less than 95°, and preferably 60° or more and less than 95°, or may be gently tapered at a taper angle of less than 45°.

Note that in order to control a threshold voltage of a transistor to be completed, the first single crystal silicon layer 806 and the second single crystal silicon layer 808 may be lightly doped with an impurity element imparting one conductivity. In this case, the impurity element is added to a channel forming region of the transistor, as well. The impurity element added at this time is added at a lower concentration than that of a high concentration impurity region serving as a source region or a drain region and that of a low concentration impurity region serving as a lightly-doped drain (LDD) region.

The gate electrodes 816 are formed by entirely forming a conductive layer over the substrate and selectively etching the conductive layer to form a desired shape. Here, after stacked structures in which conductive layers 812 and 814 are stacked are formed, the conductive layers are selectively etched and the isolated conductive layers are processed to cross the first single crystal silicon layer 806 and the second single crystal silicon layer 808 respectively, so that the gate electrodes 816 can be formed.

The conductive layers forming the gate electrode 816 can each be formed as follows: a conductive layer is formed entirely over the substrate by using a metal element such as tantalum (Ta), tungsten (W), titanium (Ti), molybdenum (Mo), chromium (Cr), aluminum (Al), copper (Cu), or niobium (Nb), or an alloy material or a compound material containing the above-described metal element by a CVD method or a sputtering method, and then the conductive layer is selectively etched Further, a semiconductor material typified by polycrystalline silicon to which an impurity element imparting one conductivity type, such as phosphorus has been added can be used as well.

Although this embodiment mode shows the example in which the gate electrodes 816 have a two-layer stacked structure of the conductive layers 812 and 814, the gate electrodes may have a single layer structure or a stacked layer structure in which three layer or more layers are stacked. In addition, the side face of the conductive layers may be tapered. In the case where the gate electrodes have a stacked structure of conductive layers, the width of the conductive layer as the bottom layer may be wider or the side face of the conductive layers may have different taper angles from each other.

Gate insulating layers 810 are formed between the gate electrode 816, and the first single crystal silicon layer 806 and the second single crystal silicon layer 808. The gate insulating layers 810 can be formed using a material such as silicon oxide ($SiO_x$), silicon oxynitride ($SiO_xN_y$, x>y>0), hafnium oxide ($HfO_x$), aluminum oxide ($Al_xO_y$), or tantalum oxide ($Ta_xO_y$, x>y>0) by a CVD method, a sputtering method, an ALD (atomic layer deposition) method or the like. Further, the gate insulating layers 810 can be formed by conducting plasma treatment to the first single crystal silicon layer 806 and the second single crystal silicon layer 808 such that they are solid-phase oxidized or solid-phase nitrided. Additionally, the insulating layers may be formed by a CVD method or the like and the insulating layers may be solid-phase oxidized or solid-phase nitrided by plasma treatment.

The solid-phase oxidation or the solid-phase nitridation is preferably conducted using plasma excited by high frequency such as a microwave (typically, 2.45 GHz). Specifically, plasma which is excited by high-frequency waves and has an electron density of from $1 \times 10^{11}$ to $1 \times 10^{13}$ cm$^3$, inclusive, and electron temperatures of from 0.5 to 1.5 eV, inclusive, is preferably used for plasma treatment. This is done so that in the solid phase oxidation treatment or solid phase nitridation treatment at temperatures of less than or equal to 500° C., a dense insulating layer is to be formed and a practical reaction speed is to be obtained.

When the surfaces of the first single crystal silicon layer 806 and the second single crystal silicon layer 808 are oxidized by plasma treatment, the plasma treatment is performed in an atmosphere containing oxygen (e.g., an atmosphere containing oxygen ($O_2$), ozone ($O_3$), nitrous oxide ($N_2O$), nitrogen monoxide (NO), or nitrogen dioxide ($NO_2$), and a rare gas (at least one of helium (He), neon (Ne), argon (Ar), krypton (Kr), and xenon (Xe)), or an atmosphere containing oxygen ($O_2$), ozone ($O_3$), nitrous oxide ($N_2O$), nitrogen monoxide (NO), or nitrogen dioxide ($NO_2$), hydrogen ($H_2$), and a rare gas). Further, when the surface of the insulating layer formed over the first single crystal silicon layer 806 and the second single crystal silicon layer 808 is nitrided by plasma treatment, the plasma treatment is performed in an atmosphere containing nitrogen (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar is preferably used, for example. Further, a gas in which Ar and Kr are mixed may also be used.

Figure 11:
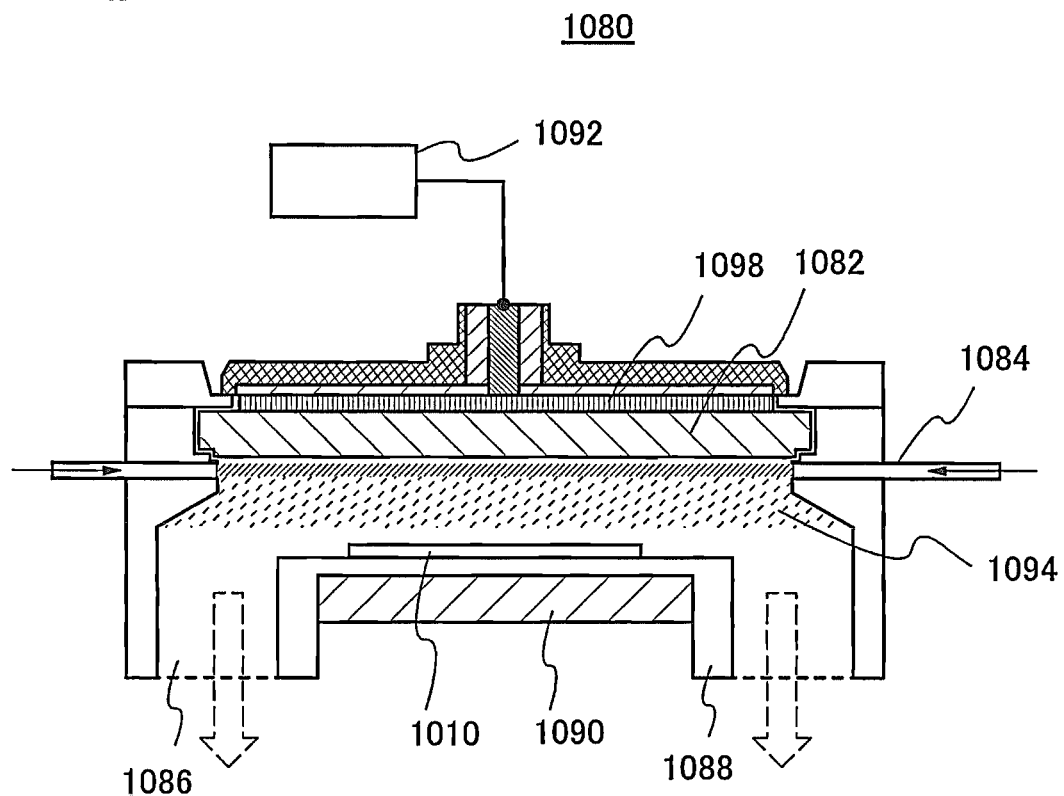
FIG. 11 illustrates an example of a structure of a plasma processing apparatus.

FIG. 11 shows a structural example of a plasma processing apparatus 1080 for performing plasma treatment. The plasma processing apparatus 1080 includes a support 1088, a gas supplying portion 1084 for supplying a gas, an exhaust port 1086 connected to a vacuum pump for exhausting a gas, an antenna 1098, a dielectric plate 1082, and a high-frequency wave supplying portion 1092 for supplying high-frequency waves for plasma generation. An object to be processed 1010 is held by the support 1088. In addition, by providing a temperature controller 1090 for the support 1088, the temperature of the object to be processed 1010 can be controlled. The object to be processed 1010 is a body which is to be subjected to plasma treatment, and corresponds to a stacked body in which the insulating layer 120 and the first and second single crystal silicon layers 806 and 808 are stacked over the substrate 150 serving as a base substrate in this embodiment mode. Further, the object to be processed 1010 corresponds to a stacked body in which an insulating layer is formed over the first single crystal silicon layer 806 and the second single crystal silicon layer 808.

Hereinafter, a specific example in which an insulating layer is formed on the surface of the single crystal silicon layer with the plasma processing apparatus 1080 shown in FIG. 11 is described. Note that the plasma treatment includes surface modification treatment, such as oxidation treatment, nitridation treatment, oxynitridation treatment, hydrogenation treatment, performed to a substrate (a single crystal silicon layer), a semiconductor layer, an insulating layer, and a conductive layer. For these treatments, a gas supplied from the gas supplying portion 1084 may be selected in accordance with an intended purpose.

First, the inside of a processing chamber of the plasma processing apparatus 1080 shown in FIG. 11 is made in vacuum and a gas containing a rare gas and oxygen or nitrogen is supplied from the gas supplying portion 1084. The object to be processed 1010 is heated at room temperature or at temperatures of from 100 to 550° C., inclusive, by the temperature controller 1090. The distance between the object to be processed 1010 and the dielectric plate 1082 (hereinafter also called an electrode interval) is approximately from 20 to 200 mm, inclusive (preferably from 20 to 60 mm, inclusive).

Next, high-frequency waves are supplied from the high-frequency wave supplying portion 1092 to the antenna 1098. Here, microwaves (frequency: 2.45 GHz) are introduced as the high-frequency waves. Then, the microwaves are introduced from the antenna 1098 into the processing chamber through the dielectric plate 1082; thus, plasma 1094 is generated. With the plasma 1094, oxygen radicals (which may include an OH radical) or nitrogen radicals (which may include an NH radical) are generated. At this time, the plasma 1094 is generated from the gas supplied.

When the plasma 1094 is generated by introducing high-frequency waves such as microwaves, plasma which has a low electron temperature (less than or equal to 3 eV, preferably less than or equal to 1.5 eV) and a high electron density (greater than or equal to $1 \times 10^{11}$ cm$^{-3}$) can be generated. Specifically, plasma which has electron temperatures of from 0.5 to 1.5 eV, inclusive, and an electron density of from $1 \times 10^{11}$ to $1 \times 10^{13}$ cm$^{-3}$, inclusive, is preferably generated. Note that in this specification, plasma which has a low electron temperature and a high electron density generated by introducing microwaves is also called high-density plasma. Further, plasma treatment utilizing high-density plasma is also called high-density plasma treatment.

With the oxygen radicals (which may include an OH radical) or nitrogen radicals (which may include an NH radical) generated by the plasma 1094, the surface of the single crystal silicon layer formed in the object to be processed 1010 is oxidized or nitrided, whereby an insulating layer is formed. In this case, if a rare gas such as argon is mixed in the gas supplied, oxygen radicals or nitrogen radicals can be generated efficiently by excited species of the rare gas. Note that in the case where a rare gas is used in the gas supplied, the rare gas may be contained in the insulating layer formed. In this method, by effective use of active radicals excited by plasma, oxidation or nitridation by a solid phase reaction can be performed at low temperatures of less than or equal to 500° C.

As one preferable example of the gate insulating layer 810 formed by plasma treatment, the first single crystal silicon layer 806 and the second single crystal silicon layer 808 are subjected to plasma treatment to form a silicon oxide layer in an atmosphere containing oxygen, and the surface of the silicon oxide layer is treated with nitridation plasma in an atmosphere containing nitrogen to form a nitrogen-plasma-treated layer. Specifically, first, the silicon oxide layer having a thickness of from 3 to 6 nm is formed over the first single crystal silicon layer 806 and the second single crystal silicon layer 808 by plasma treatment in an atmosphere containing oxygen. Then continuously, the plasma treatment in an atmosphere containing nitrogen is performed, whereby the nitrogen-plasma-treated layer with high nitrogen concentration is provided on the one surface of the silicon oxide layer or in the vicinity of the surface. Note that the "vicinity of the surface" refers to a region at a depth of approximately from 0.25 to 1.5 nm from the surface of the silicon oxide layer. For example, by performing the plasma treatment in an atmosphere containing nitrogen after forming the silicon oxide layer, the nitrogen-plasma-treated layer in which nitrogen is contained at 20 to 50 at. % in a region of the silicon oxide layer at a depth of approximately 1 nm from the surface thereof in a perpendicular direction can be formed. Further, nitrogen-plasma-treated layer can be silicon nitride or silicon nitride oxide depending on the conditions of the plasma treatment.

In any case, by the solid phase oxidation treatment or solid phase nitridation treatment with plasma treatment as described above, even if a glass substrate with an upper temperature limit of less than or equal to 600° C. is used as the substrate 150, an insulating layer which is equivalent to a thermally-oxidized film which is formed at temperatures of 950 to 1050° C. can be obtained. That is, a highly reliable insulating layer can be formed as the insulating layer that serves as a gate insulating layer in a semiconductor element, in particular, a thin film transistor or a nonvolatile memory element.

Note that FIG. 8B illustrates an example in which the end portions of the gate insulating layer 810 and the gate electrode 816 are aligned; however, this is not a limiting example, and the gate insulating layer 810 may be left when the gate electrode 816 is etched.

If a material with a high dielectric constant (also referred to as a high-k material) is used for the gate insulating layer 810, the gate electrodes 816 are formed from polycrystalline silicon, silicide, metal or metal nitride. Preferably, the gate electrodes 816 are formed from metal or metal nitride. For example, the conductive layers 812 in contact with the gate insulating layers 810 are formed from a metal nitride material, and the conductive layers 814 thereon are formed from metal materials. By adopting the combination like this, even when the gate insulating layer is thinned, a depletion layer can be prevented from expanding to the gate electrode and even when miniaturization is done, operation characteristics such as driving performance of transistors can be prevented from being damaged.

Figure 8C:
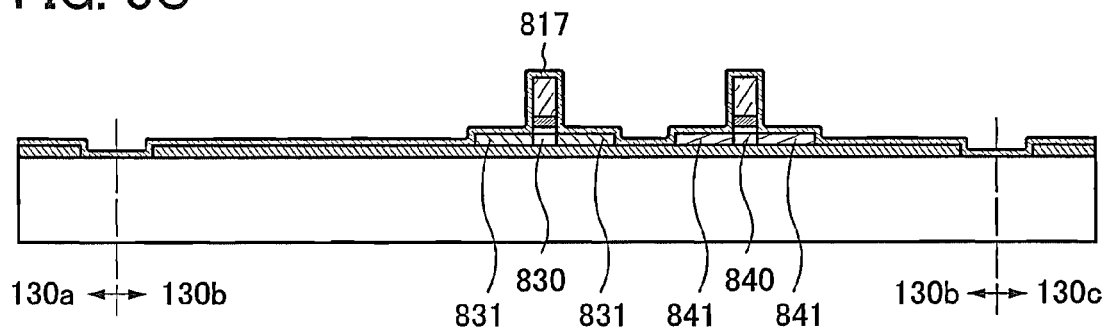

Next, an insulating layer 817 is formed over the gate electrodes 816. Then, an impurity element imparting one type of conductivity is added using the gate electrodes 816 as masks (FIG. 8C). Note that in this embodiment mode, impurity elements having different types of conductivities are added to the first single crystal silicon layer 806 and the second single crystal silicon layer 808. In the first single crystal silicon layer 806, a pair of impurity regions 831 and a channel forming region 830 between the pair of impurity regions 831 are formed using the gate electrode 816 as a mask in a self-aligned manner. Similarly, in the second single crystal silicon layer 808, a pair of impurity regions 841 and a channel forming region 840 between the pair of impurity regions 841 are formed using the gate electrode 816 as a mask in a self-aligned manner. The impurity region 831 and the impurity region 841 are added with impurity elements which has a different conductivity type from each other.

As the impurity element which imparts one conductivity type, an element which imparts p-type conductivity such as boron (B), aluminum (Al), or gallium (Ga) or an element which imparts n-type conductivity such as phosphorus (P) or arsenic (As) can be used. In this embodiment mode, an element imparting n-type conductivity, e.g., phosphorus is added to the first single crystal silicon layer 806. In addition, an element imparting p-type conductivity, e.g., boron is added to the second single crystal silicon layer 808. When the impurity element is added to the first single crystal silicon layer 806, the second single crystal silicon layer 808 may be selectively covered with a resist mask or the like. Similarly, when the impurity element is added to the second single crystal silicon layer 808, the first single crystal silicon layer 806 may be selectively covered with a resist mask or the like.

The insulating layer 817 can be formed using a material such as silicon oxide, silicon oxynitride, silicon nitride, or silicon nitride oxide by a CVD method, a sputtering method, an ALD method or the like. In addition of an impurity element having one conductivity type, the impurity element is made to pass through the insulating layer 817, so that damages on the single crystal silicon layers can be reduced.

Figure 8D:
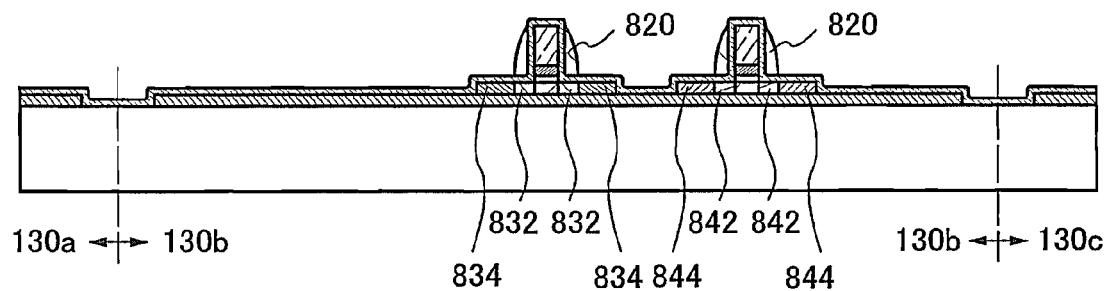

Next, sidewall insulating layers 820 are formed on the sides of the gate electrodes 816. The gate electrodes 816 and the sidewall insulating layer 820 are used as masks to add the impurity element imparting one conductivity type (FIG. 8D). Note that the impurity elements having the same conductivity as those used in the previous step (the step of forming the impurity region 831 and the impurity region 841) are added to the first single crystal silicon layer 806 and the second single crystal silicon layer 808. The impurity elements added at this time are added at higher concentration than those of the impurity elements used in the previous step.

In the first single crystal silicon layer 806, a pair of high concentration impurity regions 834 and a pair of low concentration impurity regions 832 are formed in a self-aligned manner with the gate electrode 816 and the sidewall insulating layer 820 as a mask. The high concentration impurity region 834 formed at this time serves as a source region or a drain region, and the low concentration impurity region 832 serves as an LDD (lightly doped drain) region. Similarly, in the second single crystal silicon layer 808, a pair of high concentration impurity regions 844 and a pair of low concentration impurity regions 842 are formed in a self-aligned manner with the gate electrode 816 and the sidewall insulating layer 820 as a mask. Note that when the impurity element is added to the first single crystal silicon layer 806, the second single crystal silicon layer 808 may be selectively covered with a resist mask or the like. Similarly, the impurity element is added to the second single crystal silicon layer 808, the first single crystal silicon layer 806 may be selectively covered with a resist mask or the like.

The sidewall insulating layer 820 is formed on the side face of the gate electrodes 816 with the insulating layer 817 therebetween. For example, an insulating layer formed so as to bury the gate electrodes 816 is subjected to anisotropic etching, which is conducted mainly in the perpendicular direction, so that the sidewall insulating layer 820 can be formed in a self-aligned manner on the side faces of the gate electrodes 816. The sidewall insulating layer 820 can be formed using a material such as silicon nitride, silicon nitride oxide, silicon oxide or silicon oxynitride. In a case where the insulating layer 817 is formed using silicon oxide or silicon oxynitride, the sidewall insulating layer 820 is formed using silicon nitride or silicon nitride oxide, so that the insulating layer 817 can function as an etching stopper. In addition, when the insulating layer 817 is formed using silicon nitride or silicon nitride oxide, the sidewall insulating layer 820 may be formed using silicon oxide or silicon oxynitride. In this manner, the insulating layer functioning an etching stopper is provided, so that the single crystal silicon layers can be prevented from being etched in over-etching for forming the sidewall insulating layer.

Figure 9A:
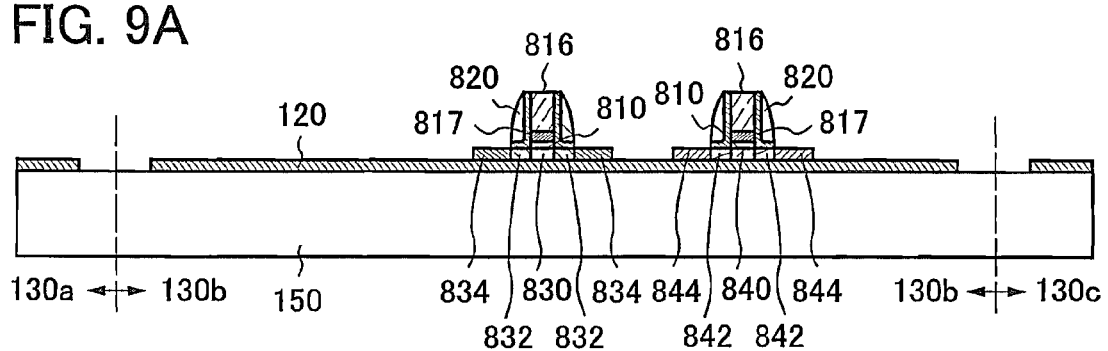
FIGS. 9A to 9D illustrate an example of a manufacturing method of a semiconductor device according to an aspect of the present invention.

Next, an exposed part of the insulating layer 817 is etched (FIG. 9A). The insulating layer 817 is left between the sidewall insulating layer 820 and the gate electrode 816, between the sidewall insulating layer 820 and the first single crystal silicon layer 806, and between the sidewall insulating layer 820 and the second single crystal silicon layer 808.

A silicide layer may be formed so that resistance of the high concentration impurity regions serving as a source region or a drain region is lowered. As the silicide layer, cobalt silicide or nickel silicide may be applied. If the thickness of the single crystal silicon layer is small, a silicide reaction may progress up to the bottom portion of the single crystal silicon layer in which the high concentration impurity regions are formed such that it may be fully silicided.

Figure 9B:
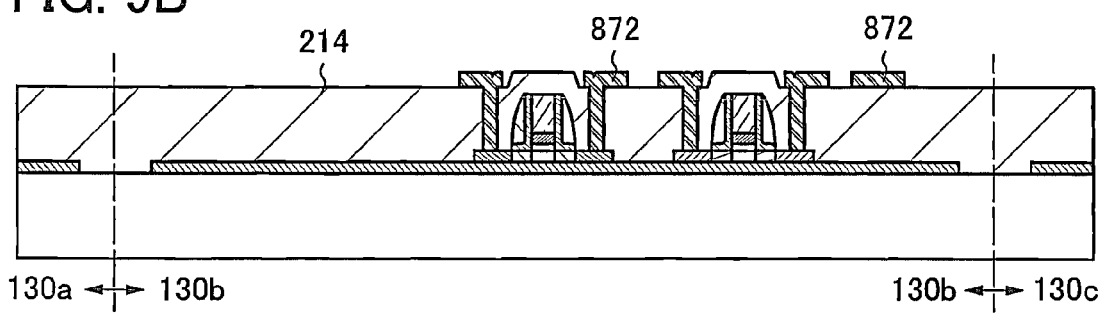

Next, after forming the insulating layer 214 entirely over the substrate 150, the insulating layer 214 is selectively etched to form openings which reach the high concentration impurity region 834 formed in the first single crystal silicon layer 806 and the high concentration impurity region 844 formed in the second single crystal silicon layer 808. A conductive layer 872 is formed so as to fill the openings (FIG. 9B).

The insulating layer 214 is formed using an inorganic insulating material containing oxygen and/or nitrogen, such as silicon oxide, silicon nitride, silicon oxynitride, or silicon nitride oxide; an insulating material containing carbon such as diamond like carbon (DLC); an organic insulating material such as epoxy, polyimide, polyamide, polyvinylphenol, benzocyclobutene, or acrylic; or a siloxane material such as siloxane resin by a CVD method, a sputtering method, an ALD method, a coating method or the like. Note that the siloxane material corresponds to a material having Si—O—Si bonds. Siloxane includes a skeleton structure of a bond of silicon (Si) and oxygen (O). As a sub stituent, an organic group containing at least hydrogen (such as an alkyl group or aromatic hydrocarbon) is used. Alternatively, a fluoro group, or a fluoro group and an organic group containing at least hydrogen can be used as a substituent. Further, the insulating layers 214 may also be formed by forming an insulating layer by a CVD method, a sputtering method, or an ALD method and then performing high-density plasma treatment thereto in an oxygen atmosphere or a nitrogen atmosphere. Although the insulating layer 214 has a single layer structure in this embodiment mode as an example, the insulating layer 214 may have a staked layer structure of two or more layers. An inorganic insulating layer and an organic insulating layer may be combined to form the insulating layer 214. For example, a silicon nitride layer or a silicon nitride oxide layer which can function as a passivation layer is formed entirely over the substrate 150, and an insulating layer including phosphorus silicate glass (PSG) or boron phosphorus silicate glass (BPSG), which can serve as a planarization layer, can be formed thereon.

The conductive layer 872 serves as a source electrode or a drain electrode, or a wiring to electrically connect an antenna formed later and the circuit portion. The conductive layer 872 serving as a source electrode or a drain electrode is electrically connected to the first single crystal silicon layer 806 and the second single crystal silicon layer 808 through the openings formed in the insulating layer 214.

The conductive layer 872 can be formed by steps of forming a conductive layer as a single layer or a stacked layer by a CVD method or a sputtering method using a metal element such as aluminum (Al), tungsten (W), titanium (Ti), molybdenum (Mo), nickel (Ni), platinum (Pt), copper (Cu), gold (Au), silver (Ag), manganese (Mn), neodymium (Nd), carbon (C), silicon (Si), or an alloy material or a compound material containing the above-described metal element over the entire surface of the substrate, and then selectively etching the conductive layer. As examples of an alloy material containing aluminum, an alloy material containing aluminum as its main component and nickel and an alloy material containing aluminum as its main component, nickel, and one or both of carbon and silicon can be given. Further, a compound material containing tungsten, tungsten silicide can be given as an example. The conductive layers 872 can employ, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin film formed of titanium, nitride of titanium, molybdenum, or nitride of molybdenum. Aluminum and aluminum silicon which have low resistance and are inexpensive are suitable for forming the conductive layer serving as a source electrode or a drain electrode. Further, generation of a hillock of aluminum or aluminum silicon can be prevented when upper and lower barrier layers are provided for the conductive layer serving as a source electrode or a drain electrode.

Figure 9C:
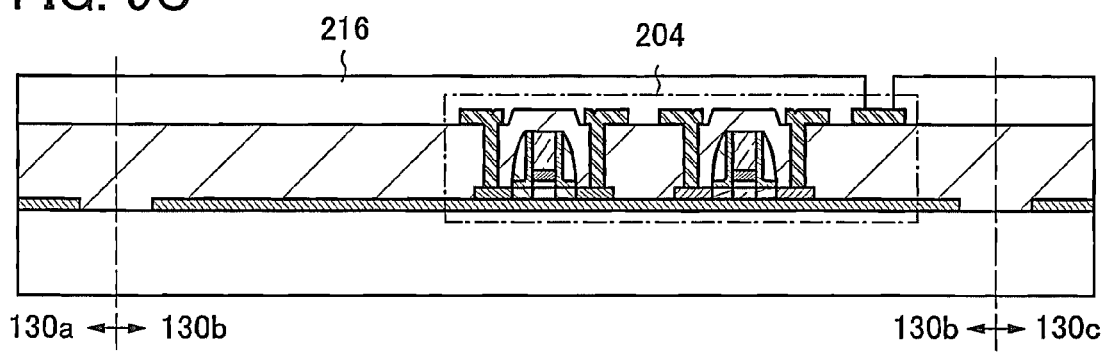

Next, an insulating layer 216 is formed over the circuit portion 204 (FIG. 9C). As the insulating layer 216, a planarization layer which can smooth unevenness caused by the circuit portion 204 and have a flat surface is preferably used. For example, the insulating layer 216 can be formed using an organic insulating material such as epoxy, polyimide, polyamide, polyvinylphenol, benzocyclobutene, or acrylic, or a siloxane material such as siloxane resin. In this embodiment mode, the insulating layer 216 has a single layer structure, but may have a stacked structure of two or more layers. In employing a stacked structure, for example, an organic resin layer can be used as a top layer and an inorganic insulating layer such as silicon oxide, silicon nitride, or silicon oxynitride can be used as a bottom layer.

Next, the antenna 202 is formed over the insulating layer 216. A single layer structure or a stacked structure of a conductive layer(s) is formed by a CVD method, a sputtering method, a printing method such as a screen printing method or a gravure printing method, a droplet discharge method, a dispenser method, a plating method or the like, and etched into a desired shape, so that the antenna 202 is formed. As the conductive material, a metal element such as aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material including any of the above materials is used.

Through the above steps, the element layer 210 is formed, in which the circuit portion 204 and the antenna 202 connected to the circuit portion 204 are stacked. Note that in addition to the transistors, the circuit portion 204 formed in the element layer 210 may include a resistor, a capacitor or the like which is formed at the same time as the transistors. In addition, the structure of the transistors is not limited to that shown in FIGS. 7A and 7B. For example, the transistors of the circuit portion 204 may have a multigate structure in which plural gates are provided for one single crystal silicon layer.

Figure 9D:
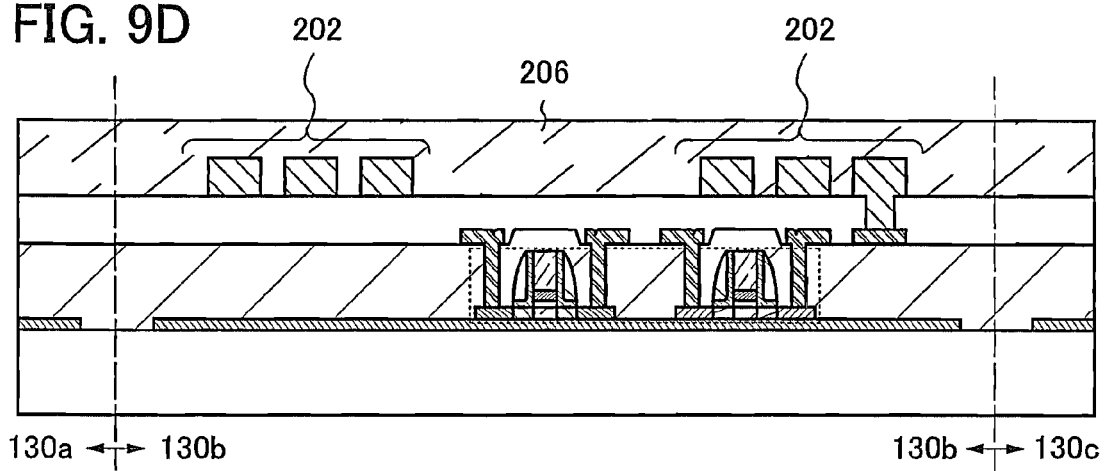

Next, the sealing layer 206 is formed over the element layer 210 (FIG. 9D). The surface of the element layer 210 is sealed with the sealing layer 206.

The sealing layer 206 is formed to protect the element layer 210 from a later sectioning process or dusts. There are no particular limitations on the material of the sealing layer 206, but such a material is preferable, that can be easily formed as a film, for example, a resin is preferable. As such a resin used for the sealing layer 206, a thermosetting resin or a light-curing resin (UV curing resin or visible light curable resin) can be used for example, and an epoxy resin can be used as resin material. If an epoxy resin is used as the sealing layer 206, the planarity of the surface of the sealing layer 206 is increased and the element layer can be protected from a later sectioning process or dusts.

Through the above steps, a structure 212 including the element layer 210 is formed, and in the element layer 210, the circuit portion 204 and the antenna 202 connected to the circuit portion 204 are stacked over the substrate 150. Although in this example, the structure 212 is formed in the stacked body 130b, structures may be formed in the adjacent stacked bodies 130a and 130c at the same time, needless to say. Further, a plurality of antennas and circuit portions may be formed, although one antenna 202 and one circuit portion 204, which are included in the stacked body 130b, are shown in this example.

Figure 10:
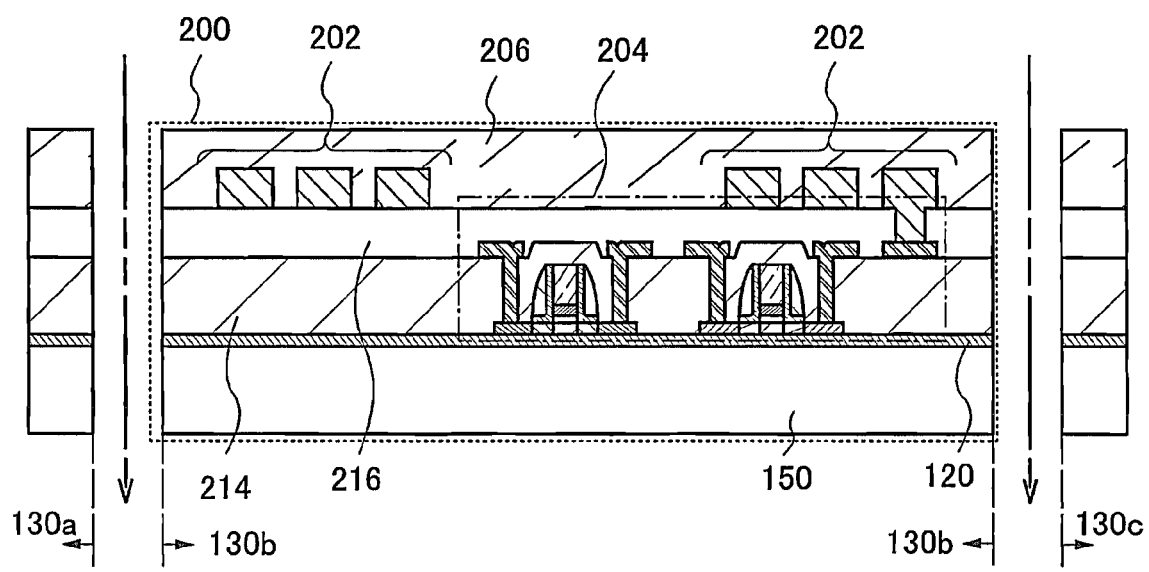
FIG. 10 illustrates an example of a manufacturing method of a semiconductor device according to an aspect of the present invention.

Next, the substrate 150 is sectioned to divide the structure 212 into each RF tag 200 (FIG. 10). Through the above steps, the RF tag 200 is completed.

For sectioning of the substrate 150, a cutting device such as a dicer or a wire saw, a device using a laser beam, a device using plasma, a device using an electron beam or an optional device for cutting can be used.

The SOI substrate is used, in which a plurality of single crystal silicon thin films 110 having a chip size are formed on the substrate 150. In other words, the single crystal silicon thin film constituting a part of the element layer in a chip for forming one RF tag is separated from a single crystal silicon thin film in a chip for forming another RF tag. Thus, the single crystal silicon thin film can be prevented from being damaged in dividing into each chip by sectioning, and yield can be increased.

Figure 15A:
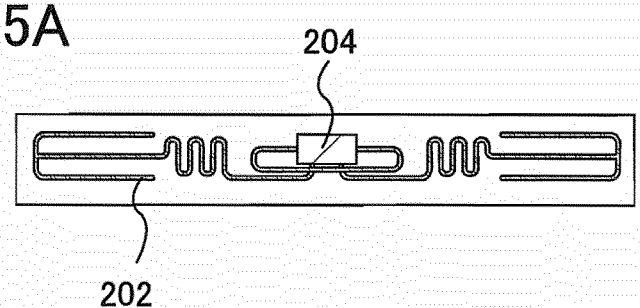
FIGS. 15A to 15D illustrate an antenna which can be applied to a semiconductor device according to an aspect of the present invention.
Figure 15B:
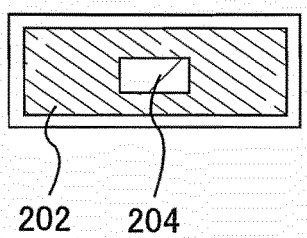
Figure 15C:
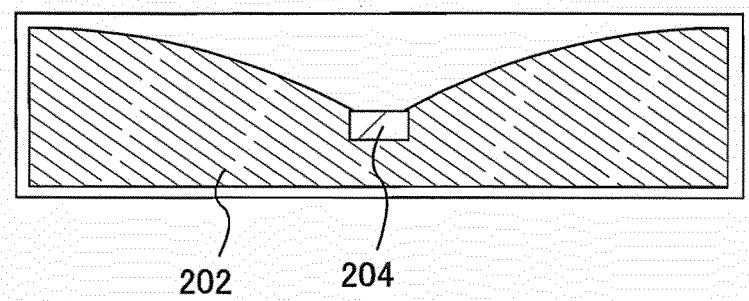
Figure 15D:
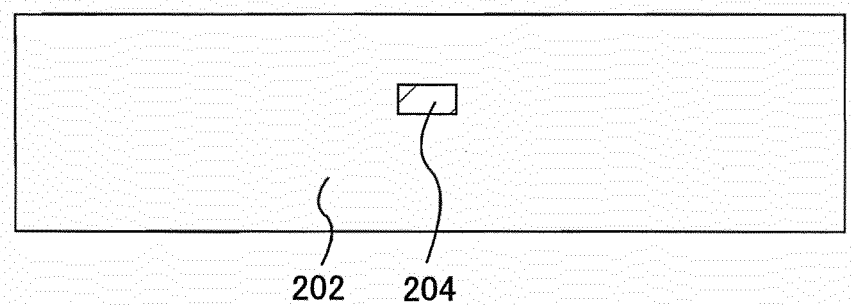

The RF tag 200 illustrated in FIGS. 6A to 6C and other drawings has a spiral antenna 202, but may have an antenna having another shape. For example, the antenna 202 may be linear (e.g., a dipole antenna (FIG. 15A)), flat (e.g., a patch antenna (FIG. 15B) or ribbon-shaped (FIGS. 15C and 15D), or the like. Further, the antenna 202 is not limited to a linear shape, and the antenna may have a curved shape, a serpentine curved shape, or in a shape combining them in consideration of the wavelength of the electromagnetic wave.

Next, an operation example of a semiconductor device which can input and output data without contact, as one of wireless communication semiconductor devices is described.

Figure 16A:
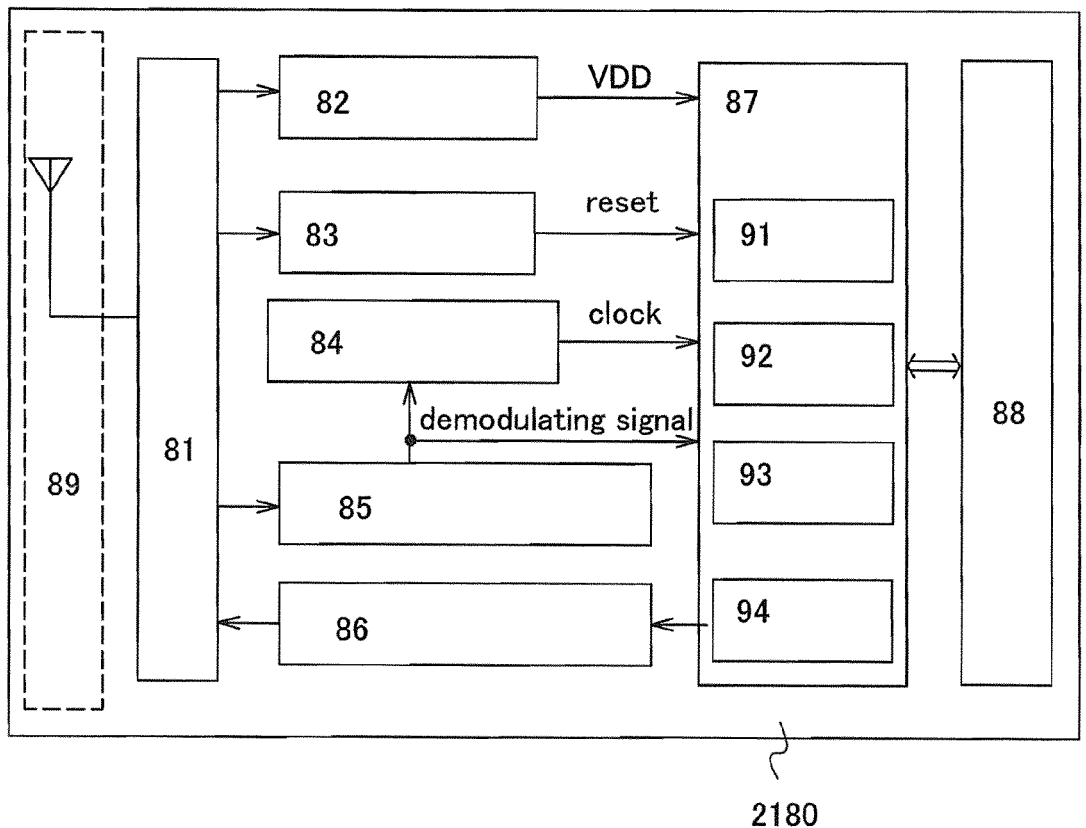
FIGS. 16A, 16B and 16C are a block diagram and diagrams showing an application example of a semiconductor device according to an aspect of the present invention.

The semiconductor device 2180 has a function of exchanging data without contact, and includes a high-frequency circuit 81, a power source circuit 82, a reset circuit 83, a clock generating circuit 84, a data demodulating circuit 85, a data modulating circuit 86, a controlling circuit 87 for controlling other circuits, a memory circuit 88, and an antenna 89 (FIG. 16A). The high-frequency circuit 81 receives a signal from the antenna 89 and then outputs a signal received from the data modulating circuit 86 through the antenna 89. The power source circuit 82 generates a power source potential from a received signal. The reset circuit 83 generates a reset signal. The clock generating circuit 84 generates various clock signals based on a received signal input from the antenna 89. The data demodulating circuit 85 demodulates a received signal and outputs it to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a reference code. The CRC judging circuit 93 detects whether or not there is a transmission error or the like based on a judged code. In FIG. 16A, in addition to the controlling circuit 87, the high-frequency circuit 81 and the power source circuit 82 which are analog circuits are included.

Next, one example of an operation of the aforementioned semiconductor device 2180 is described. First, a wireless signal is received by the antenna 89 and then sent to the power source circuit 82 through the high-frequency circuit 81, so that a high power source potential (hereinafter referred to as VDD) is generated. VDD is supplied to each circuit in the semiconductor device 2180. A signal sent to the data demodulating circuit 85 through the high-frequency circuit 81 is demodulated (hereinafter this signal is called a demodulated signal). Moreover, signals passed through the reset circuit 83 and the clock generating circuit 84 through the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is output. The output information of the semiconductor device is encoded through the output unit circuit 94. Further, the encoded information of the semiconductor device 2180 passes through the data modulating circuit 86 and then is sent by the antenna 89 as a wireless signal. Note that a low power source potential (hereinafter called VSS) is common in the plurality of circuits included in the semiconductor device 2180 and GND can be used as VSS.

In this manner, by sending a signal from a communication unit (e.g., a reader/writer or a unit having a function of a reader or a writer) to the semiconductor device 2180 and receiving a signal sent from the semiconductor device 2180 by the communication unit, data of the semiconductor device can be read.

Further, in the semiconductor device 2180, a power source voltage may be supplied to each circuit by electromagnetic waves without providing a power source (a battery), or a power source (battery) may be provided so that a power source voltage is supplied to each circuit by both electromagnetic waves and the power source (battery).

Note that the above describe RF tag 200 can be applied to the semiconductor device 2180.

Figure 16B:
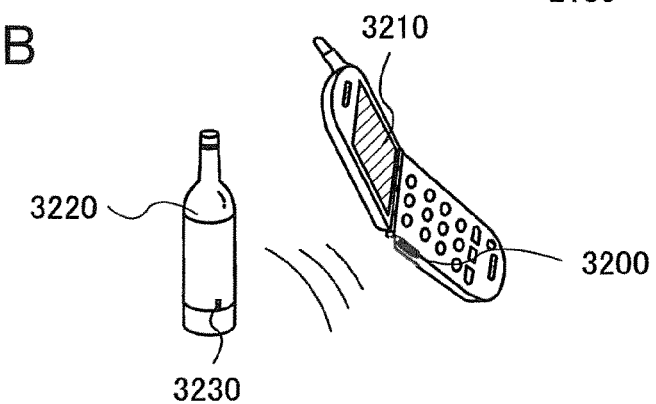
Figure 16C:
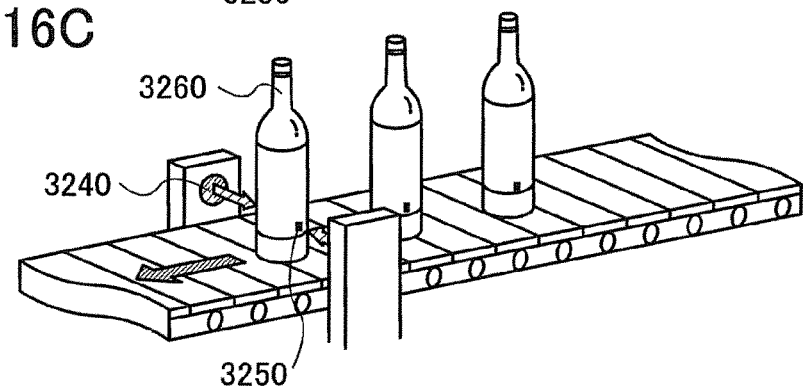

Next, one example of usage modes of the semiconductor device to/from which can communicate data wirelessly and can be input/output without contact is described. The side surface of a mobile terminal including a display portion 3210 is provided with a communication unit 3200, and the side face of a product 3220 is provided with a semiconductor device 3230 (FIG. 16B). Note that the communication unit 3200 has a function of reading and transmitting a signal like a reader/writer, or has only a function of reading a signal or transmitting a signal. When the communication unit 3200 is held over the semiconductor device 3230 included in the product 3220, the display portion 3210 displays information on the product, such as a row material, a place of origin, an inspection result for each production step, a history of distribution process, description of the product, or the like. Further, while a product 3260 is transferred by a conveyer belt, the product 3260 can be inspected by using a communication unit 3240 and a semiconductor device 3250 provided for the product 3260 (FIG. 16C). As the semiconductor devices 3230 and 3250, the aforementioned semiconductor device 2180 can be applied. In this manner, by using the semiconductor device according to the present invention in the system, information can be obtained easily and higher performance and a high added value are achieved. Furthermore, by using the SOI substrate according to the present invention, productivity can be increased and the manufacturing cost can be reduced. Therefore, system such as inspection of products can be conducted at low cost.

Note that an applicable range of the semiconductor device according to the present invention is wide in addition to the above, and the semiconductor device can be applied to any product as long as it clarifies information of an object, such as the history thereof, without contact and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 17A to 17H.

Figure 17A:
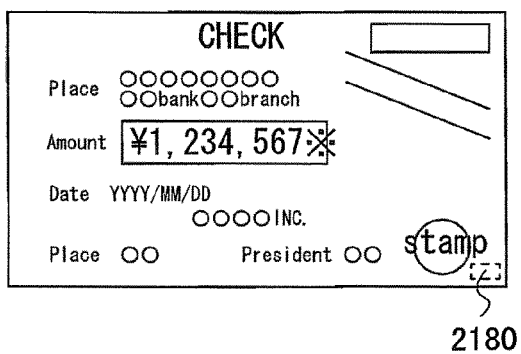
FIGS. 17A to 17H illustrate application examples of a semiconductor device according to an aspect of the present invention.
Figure 17B:
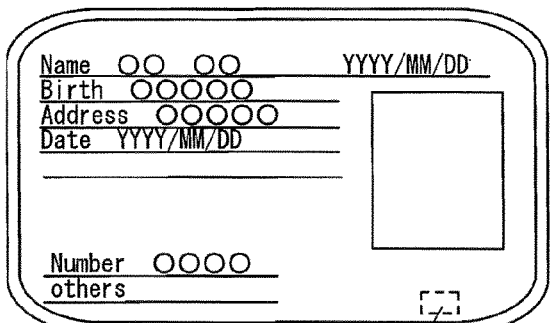
Figure 17C:
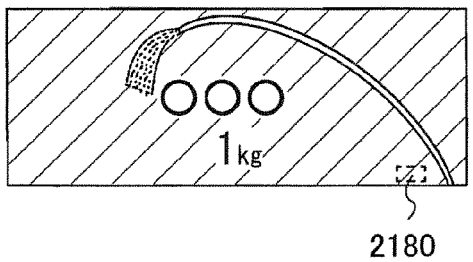
Figure 17D:
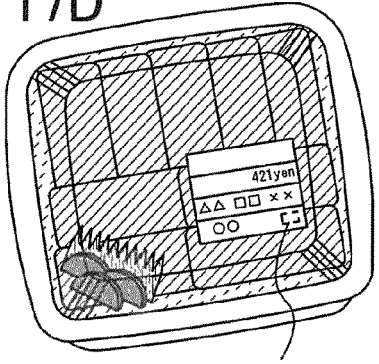
Figure 17E:
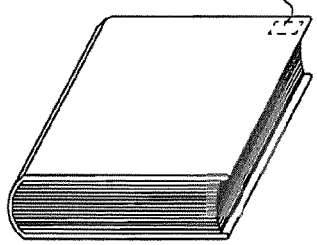
Figure 17F:
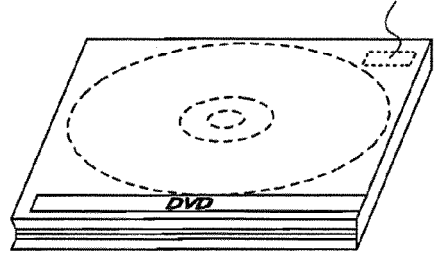
Figure 17G:
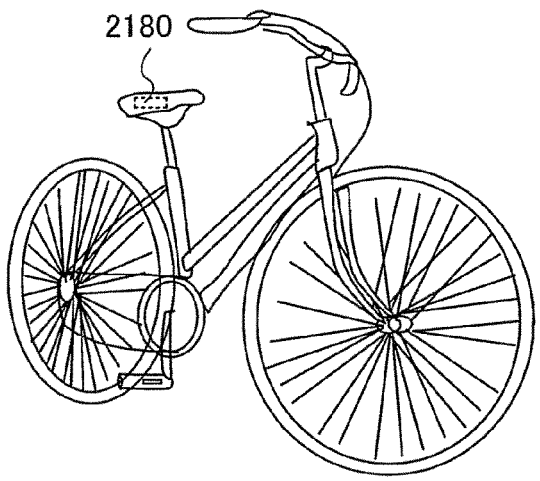
Figure 17H:
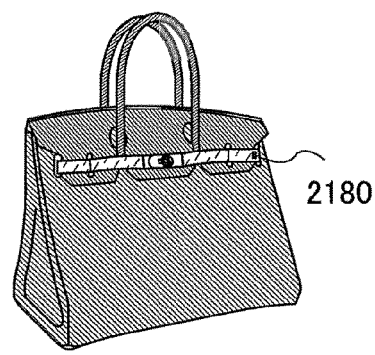

The bills and coins are money distributed in the market, and include one valid in a certain area (a cash voucher), memorial coins, and the like. The securities refer to checks, certificates, promissory notes, and the like (FIG. 17A). The certificates refer to driver's licenses, certificates of residence, and the like (FIG. 17B). The bearer bonds refer to stamps, rice coupons, various gift certificates, and the like (FIG. 17C). The packing containers refer to wrapping paper for food containers and the like, plastic bottles, and the like (FIG. 17D). The books refer to hardbacks, paperbacks, and the like (FIG. 17E). The recording media refer to DVD software, video tapes, and the like (FIG. 17F). The vehicles refer to wheeled vehicles such as bicycles, ships, and the like (FIG. 17G). The personal belongings refer to bags, glasses, and the like (FIG. 17H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-panel TV sets), cellular phones, and the like.

Forgery can be prevented by providing the semiconductor device 2180 for bills, coins, securities, certificates, bearer bonds, or the like. Further, the efficiency of an inspection system, a system used in a rental shop, or the like can be improved by providing the semiconductor device 2180 for packing containers, books, recording media, personal belongings, food, commodities, electronic devices, or the like. Forgery or theft can be prevented by providing the semiconductor device 2180 for vehicles, health products, medicine, or the like; and in the case of the medicine, medicine can be prevented from being taken mistakenly. The semiconductor device 2180 can be attached to the surface or embedded in the object. For example, in the case of a book, the semiconductor device 2180 may be embedded in paper; and in the case of a package made of an organic resin, the semiconductor device 2180 may be embedded in the organic resin.

As described above, the efficiency of an inspection system, a system used in a rental shop, or the like can be improved by providing the semiconductor device for packing containers, recording media, personal belonging, food, clothing, commodities, electronic devices, or the like. Further, by providing the semiconductor device for the vehicles or the like, forgery or theft thereof can be prevented. Further, by implanting the semiconductor device in a creature such as an animal, an individual creature can be easily identified. For example, by implanting/attaching the semiconductor device with a sensor into a creature such as livestock, its health condition such as a current body temperature as well as its birth year, sex, breed, or the like can be easily managed.

This embodiment mode can be freely combined with any of the other embodiment modes in this specification.

Embodiment Mode 2

Embodiment Mode 2 will describe one mode in which an SOI substrate according to the present invention is used to form a semiconductor device having a different structure from that of Embodiment Mode 1. Specifically, a semiconductor device in which an insulating layer is buried between semiconductor layers as an element isolation structure will be described with reference to FIGS. 18A to 19B.

Figure 18A:
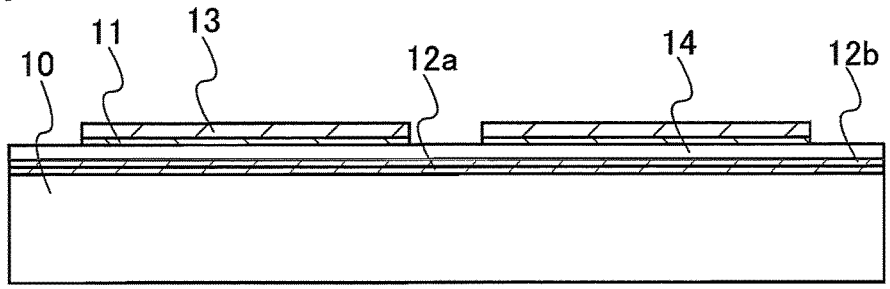
FIGS. 18A to 18E illustrate an example of a manufacturing method of a semiconductor device according to an aspect of the present invention.

In FIG. 18A, an insulating layer 12a and an insulating layer 12b serving as base insulating layers (hereinafter, the insulating layer 12a and the insulating layer 12b are also collectively referred to as a base insulating layer 12) are formed over a substrate 10. The insulating layer 12a is formed on the substrate 10 side, and the insulating layer 12b is formed on a single crystal silicon layer 14 side. The insulating layer 12a and the insulating layer 12b are bonded to each other, so that the single crystal silicon layer 14 and the substrate 10 are fixed. Bonding the single crystal silicon layer 14 to the substrate 10 is done in a similar method to that of Embodiment Mode 1.

A silicon nitride layer 11 and a silicon oxide layer 13 are formed in each element formation region over the single crystal silicon layer 14. The silicon oxide layer 13 is used as a hard mask in etching the single crystal silicon layer 14 for element isolation. The silicon nitride layer 11 serves as an etching stopper.

The single crystal silicon layer 14 is preferably from 5 nm to 30 nm thick, preferably from 10 nm to 25 nm thick. In order to control a threshold voltage, a p-type impurity element such as boron, aluminum or gallium is added to the single crystal silicon layer 14. For example, boron as a p-type impurity element may be added at a concentration within the range of from $5 \times 10^{17}$ cm$^{-3}$ to $1 \times 10^{18}$ cm$^{-3}$ inclusive.

Figure 18B:
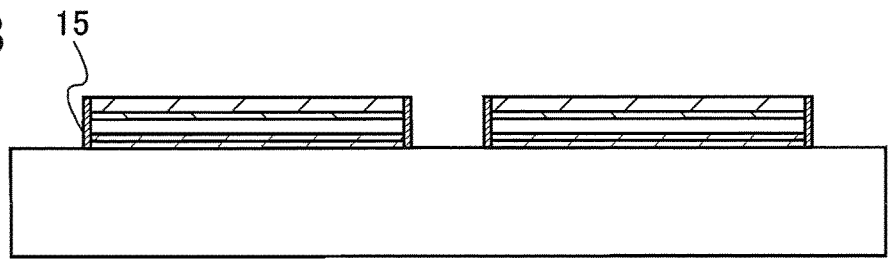

FIG. 18B illustrates a step of etching the single crystal silicon layer 14 and the base insulating layer 12 using the silicon oxide layer 13 as a mask. The exposed side faces of the silicon oxide layer 13, the silicon nitride layer 11, the single crystal silicon layer 14 and the base insulating layer 12 are nitrided by plasma treatment. By this nitridation treatment, a nitriding-treatment layer 15 is formed in the peripheral end portion of the silicon oxide layer 13, the silicon nitride layer 11, the single crystal silicon layer 14 and the base insulating layer 12. In addition, a silicon nitride layer is formed at least in the peripheral end portion of the single crystal silicon layer 14 as the nitriding-treatment layer 15. The silicon nitride layer formed in the peripheral end portion of the single crystal silicon layer 14 has an insulating property, and has a function of preventing leakage current from flowing at an end portion of the single crystal silicon layer 14. In addition, the silicon nitride layer has resistance to oxidation, and can prevent formation of "bird's beak" due to growth of the oxide film from the end portion between the single crystal silicon layer 14 and the base insulating layer 12.

Figure 18C:
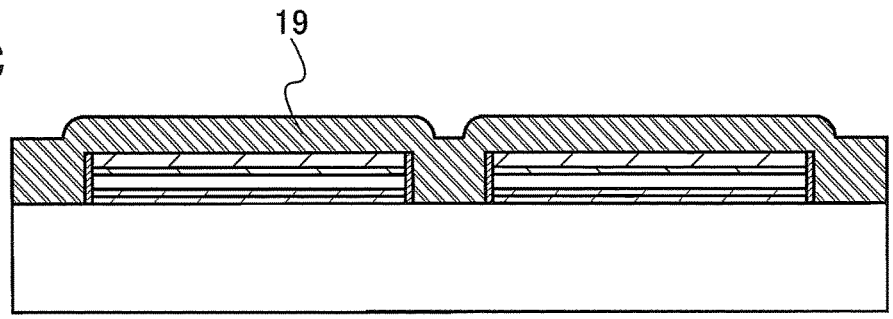

FIG. 18C illustrates a step of depositing an element-isolation insulating layer 19. The element-isolation insulating layer 19 is formed from a silicon oxide film by a CVD method using a TEOS as a source gas. The element-isolation insulating layer 19 is formed thick so as to bury the single crystal silicon layer 14.

Figure 18D:
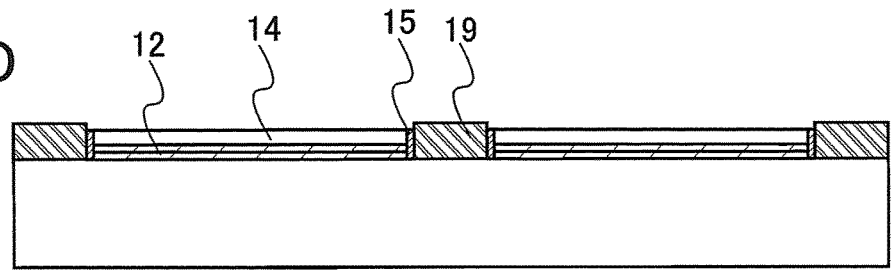

FIG. 18D illustrates a step of removing the element-isolation insulating layer 19 so as to expose the silicon nitride layer 11. This removing step can be conducted by dry etching or chemical mechanical polishing. The silicon nitride layer 11 serves as an etching stopper. The element-isolation insulating layer 19 is left so as to be buried between the single crystal silicon layers 14. The silicon nitride layer 11 is removed later.

Figure 18E:
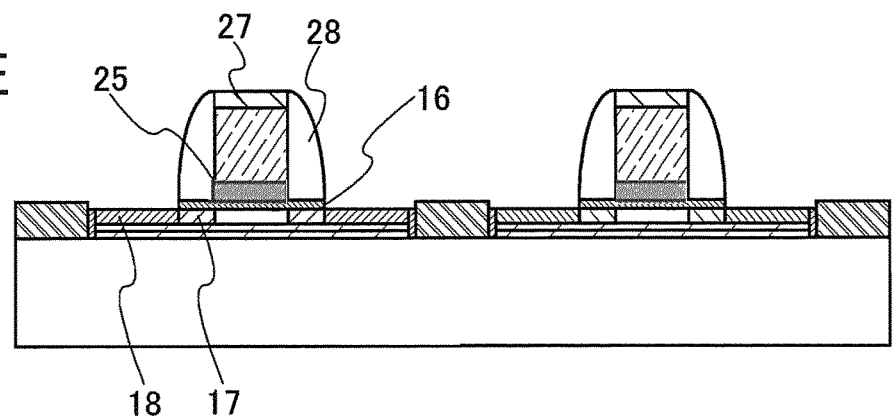

In FIG. 18E, after the single crystal silicon layer 14 is exposed, a gate insulating layer 16, a gate electrode 25, and a sidewall insulating layer 28 are formed to form a first impurity region 18 and a second impurity region 17. The insulating layer 27 is formed of silicon nitride, and is used as a hard mask for etching the gate electrode 25.

Figure 19A:
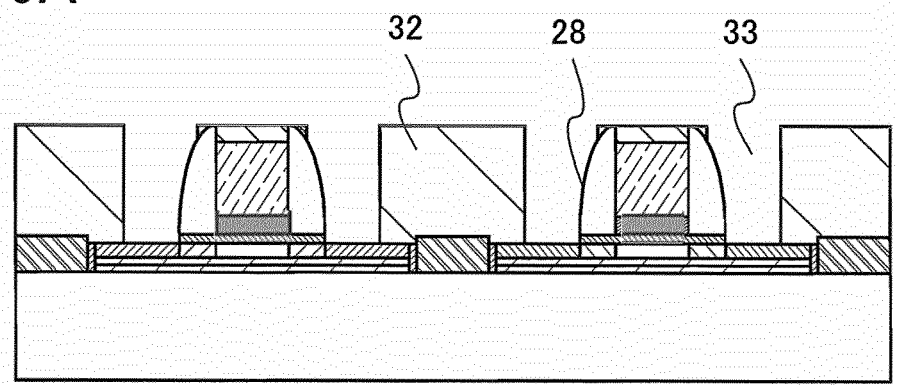
FIGS. 19A and 19B illustrate an example of a manufacturing method of a semiconductor device according to an aspect of the present invention.

In FIG. 19A, an interlayer insulating layer 32 is formed. As the interlayer insulating layer 32, a borophosphosilicate glass (boron phosphorus silicate glass, BPSG) is formed and planarized by a reflow process. Alternatively, a silicon oxide film may be formed using TEOS (tetraethoxy silane) as a source gas, and may be planarized by a chemical mechanical polishing process. The insulating layer 27 over the gate electrode 25 serves as an etching stopper in the planarizing process. Contact holes 33 are formed in the interlayer insulating layer 32. The contact holes 33 have a self-aligned structure due to the sidewall insulating layer 28.

Figure 19B:
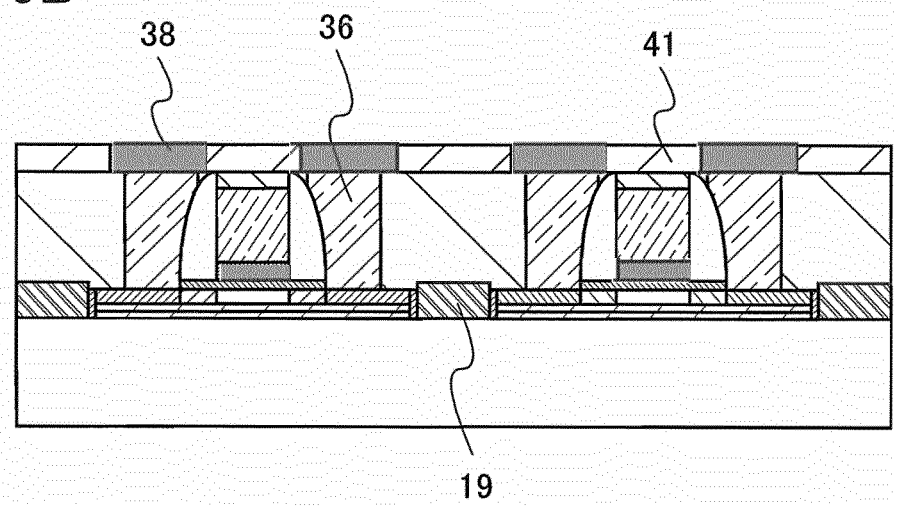

Next, as illustrated in FIG. 19B, contact plugs 36 are formed by CVD using tungsten hexafluoride. Further, an insulating layer 41 is formed and openings are formed in positions above the contact plugs 36 to form wirings 38. The wirings 38 are formed with aluminum or an aluminum alloy. Specifically, the wirings 38 are each formed with a metal film which has a barrier metal such as molybdenum, chromium, or titanium as each of top and bottom layers.

In this manner, a field-effect transistor including a single crystal silicon layer can be formed on a substrate having an insulating surface. In according to this embodiment mode, by using a large area SOI substrate formed in Embodiment Mode 1, in formation of a circuit pattern of a semiconductor device such as a RF tag or an LSI, by using a large area substrate, a manufacturing process can be conducted at all once, so that productivity can be increased. In addition, an SOI substrate is formed from a plurality of single crystal silicon thin films. The size of each single crystal silicon substrate is set to have a size of a chip such as a RF tag or an LSI, or almost the same size as such a chip, and yield in manufacturing a semiconductor device such as a semiconductor integrated circuit or the like can be increased.

Embodiment Mode 3

Embodiment Mode 3 will describe an example of forming a semiconductor device using an SOI substrate according to the present invention, which is different from those of the above embodiment modes. As an example shown in this embodiment mode, a semiconductor chip such as an LSI chip is manufactured and the semiconductor chip is applied to a central processing unit (CPU).

Figure 12:
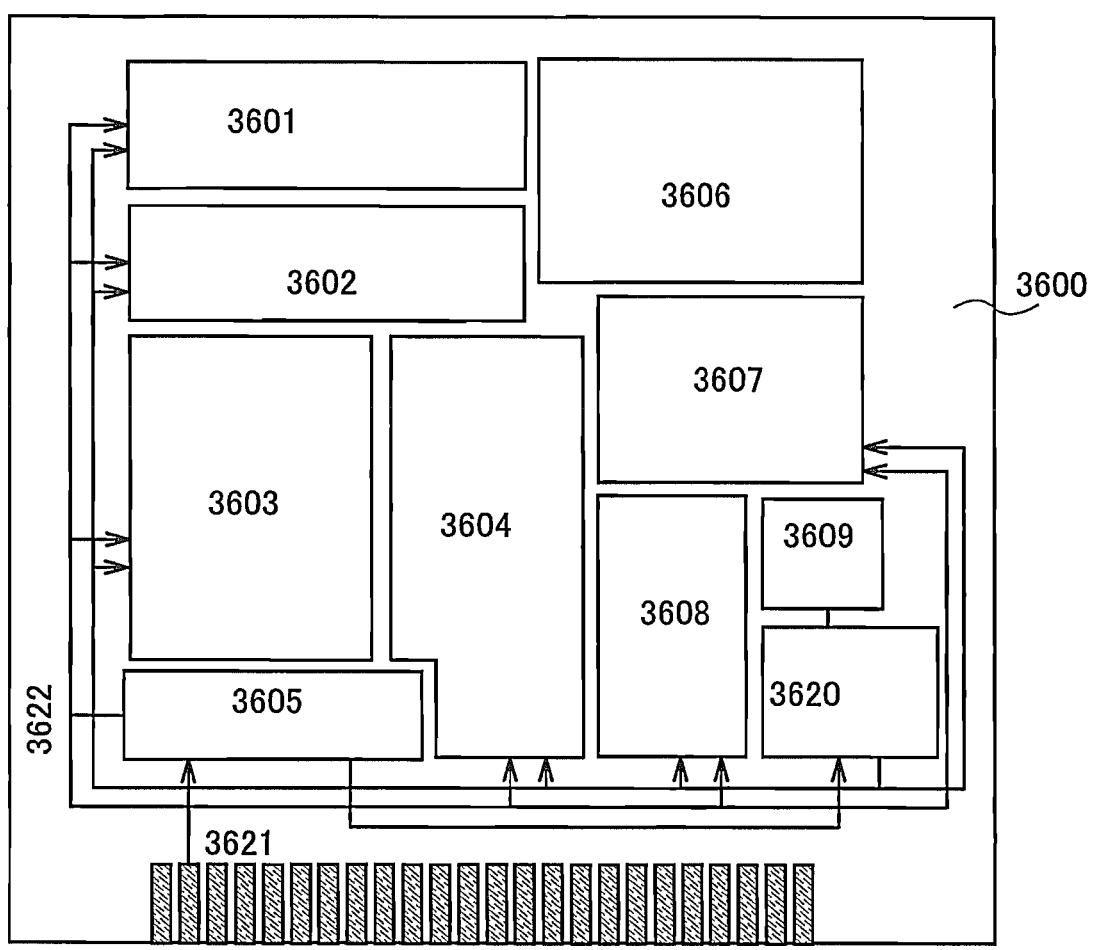
FIG. 12 is a block diagram illustrating an example of a semiconductor device according to an aspect of the present invention.

A CPU 3660 shown in FIG. 12 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, a rewritable ROM 3609, and a ROM interface (ROM I/F) 3620, over a substrate 3600. The ROM 3609 and the ROM interface 3620 may be provided over a different chip. Such various circuits included in the CPU 3660 can be formed by using the transistor described in any of Embodiment Modes 2 and 3, or an nMOS transistor, a pMOS transistor, a CMOS transistor, or the like formed by combining the thin film transistors.

Note that the CPU 3660 shown in FIG. 12 is just an example in which the structure of the CPU is simplified, and an actual CPU has a wide variety of structures depending on the uses. Therefore, the structure of the CPU to which the present invention is applied is not limited to that shown in FIG. 12.

An instruction input to the CPU 3660 through the bus interface 3608 is input to the instruction decoder 3603 and decoded therein, and then input to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Specifically, the ALU controller 3602 generates a signal for controlling the drive of the ALU 3601. While the CPU 3660 is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates a signal for controlling a timing of drive of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the internal clock signal CLK2 to the above various circuits.

Figure 13:
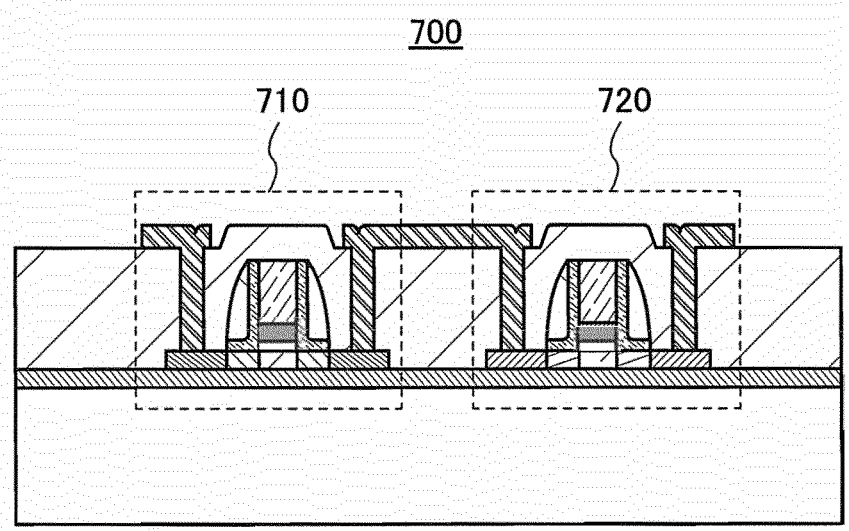
FIG. 13 illustrates an example of a semiconductor device according to an aspect of the present invention.

An example of a CMOS circuit which can be applied to the CPU 3660 is shown. A CMOS circuit 700 illustrated in FIG. 13 includes a transistor 710 and a transistor 720 which have different conductivity types from each other. The transistors 710 and 720 can be formed using the same process as the transistors formed in the circuit portion 204 as shown in Embodiment Mode 1. The transistors 710 and 720 are electrically connected to each other by a conductive layer serving as a source electrode or a drain electrode, which is provided between the transistors 710 and 720. Although FIG. 13 illustrates an example in which the transistors shown in Embodiment Mode 1 are applied, transistors shown in Embodiment Mode 2 can also be used in the present invention, without particular limitations. Other transistors having known structures can also be used.

Figure 14:
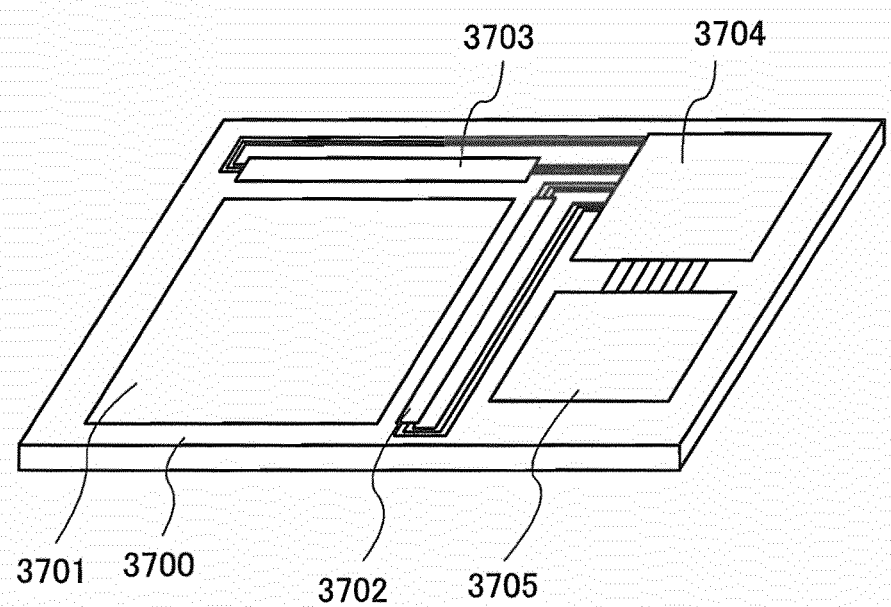
FIG. 14 is a perspective view of an example of a semiconductor device according to an aspect of the present invention.

A display device in which a pixel portion, a CPU, and other circuits are formed over the same substrate, a so-called system-on-panel is shown in FIG. 14. A pixel portion 3701, a scanning line driver circuit 3702 for selecting a pixel included in the pixel portion 3701, and a signal line driver circuit 3703 for supplying a video signal to each selected pixel are provided over a substrate 3700. The scanning line driver circuit 3702 and the signal line driver circuit 3703 are connected to a CPU 3704, another circuit (e.g., a control circuit 3705), and the like by wirings led from the scanning line driver circuit 3702 and the signal line driver circuit 3703. FIG. 14 illustrates an example in which the scanning line driver circuit 3702 and the signal line driver circuit 3703 are connected to the CPU 3704 by wirings led from the scanning line driver circuit 3702 and the signal line driver circuit 3703. Note that the control circuit includes an interface. Further, a connection portion for connection to an FPC terminal is provided at the end portion of the substrate to communicate with an external signal.

As the other circuits, in addition to the control circuit 3705, an image signal processing circuit, a power source circuit, a gray scale power source circuit, a video RAM, a memory (e.g., DRAM, SRAM, or PROM), and/or the like can be provided. Further, such a circuit may be formed using an IC chip and mounted on the substrate. Furthermore, the scanning line driver circuit 3702 and the signal line driver circuit 3703 are not necessarily formed over the same substrate as the pixel portion; for example, the scanning line driver circuit 3702 may be formed over the same substrate as the pixel portion and the signal line driver circuit 3703 may be formed using an IC chip and mounted on the substrate. The IC chip can be formed using an SOI substrate according to the present invention.

This embodiment mode has described the example in which the semiconductor device is applied to a CPU; however the present invention is not limited to this example. For example, the semiconductor device according to this embodiment mode can be applied to a display portion, a driver circuit portion and the like of display devices including an organic light-emitting element, an inorganic light-emitting element, a liquid crystal display element, or the like. Further, by using the semiconductor device according to this embodiment mode, a camera such as a digital camera, an audio reproducing device such as a car audio, a laptop personal computer, a game console, a portable information terminal (a cellular phone, a portable game machine and the like), an image reproducing device provided with a recording medium, such as a home game console, and the like can be manufactured.

The semiconductor device according to this embodiment mode is formed using the SOI substrate according to the present invention, thereby increasing productivity thereof. Thus, cost reduction can be achieved.

This embodiment mode can be freely combined with any of the other embodiment modes in this specification.

This application is based on Japanese Patent Application Serial No. 2007-079946 filed with Japan Patent Office on Mar. 26, 2007, the entire contents of which are hereby incorporated by reference.

What is claimed is:
1. A manufacturing method of an SOI substrate, comprising the steps of:
   forming an insulating layer on one surface of a first single crystal silicon substrate;
   forming an embrittlement layer in the first single crystal silicon substrate;
   cutting the first single crystal silicon substrate to form a plurality of second single crystal silicon substrates each of which has a chip size after the step of forming the embrittlement layer;
   bonding a substrate having an insulating surface and the plurality of second single crystal silicon substrates with the insulating layer therebetween;
   separating the plurality of second single crystal silicon substrates along the embrittlement layer together by heat treatment; and
   forming a plurality of single crystal silicon thin films over the substrate having an insulating surface.

2. The manufacturing method of an SOI substrate according to claim 1, wherein the second single crystal silicon substrates are formed such that the chip size is in the range of from 10 mm square to 20 mm square.

3. The manufacturing method of an SOI substrate according to claim 1, wherein the substrate having an insulating surface is a glass substrate.

4. The manufacturing method of an SOI substrate according to claim 1, wherein a size of the single crystal silicon thin films corresponds to a size of a semiconductor chip including a wireless communication semiconductor device.

5. The manufacturing method of an SOI substrate according to claim 1, wherein a size of the single crystal silicon thin films corresponds to a size of a semiconductor chip including a semiconductor integrated circuit.

6. A manufacturing method of an SOI substrate, comprising the steps of:
   forming an insulating layer on one surface of a first single crystal silicon substrate;
   forming an embrittlement layer in the first single crystal silicon substrate;
   cutting the first single crystal silicon substrate to form a plurality of second single crystal silicon substrates each of which has a chip size after the step of forming the embrittlement layer;
   forming a base insulating layer over a substrate;
   bonding the substrate and the plurality of second single crystal silicon substrates with the insulating layer and the base insulating layer therebetween;
   separating the plurality of second single crystal silicon substrates along the embrittlement layer together by heat treatment; and
   forming a plurality of single crystal silicon thin films over the substrate.

7. The manufacturing method of an SOI substrate according to claim 6, wherein the second single crystal silicon substrates are formed such that the chip size is in the range of from 10 mm square to 20 mm square.

8. The manufacturing method of an SOI substrate according to claim 6, wherein the substrate is a glass substrate.

9. The manufacturing method of an SOI substrate according to claim 6, wherein a size of the single crystal silicon thin films corresponds to a size of a semiconductor chip including a wireless communication semiconductor device.

10. The manufacturing method of an SOI substrate according to claim 6, wherein a size of the single crystal silicon thin films corresponds to a size of a semiconductor chip including a semiconductor integrated circuit.

* * * * *